(12) United States Patent
Park et al.

(10) Patent No.: US 11,721,655 B2
(45) Date of Patent: Aug. 8, 2023

(54) MEMORY DEVICE INCLUDING MEMORY CHIP AND PERIPHERAL MEMORY CHIP AND METHOD OF MANUFACTURING THE MEMORY DEVICE

(71) Applicant: Samsung Electronics Co., Ltd., Suwon-si (KR)

(72) Inventors: Jooyong Park, Hwaseong-si (KR); Chanho Kim, Seoul (KR); Pansuk Kwak, Seoul (KR); Daeseok Byeon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/381,782

(22) Filed: Jul. 21, 2021

(65) Prior Publication Data

US 2022/0157754 A1 May 19, 2022

(30) Foreign Application Priority Data

Nov. 19, 2020 (KR) .................. 10-2020-0155424

(51) Int. Cl.
| | | |
|---|---|---|
| H01L 25/065 | (2023.01) | |
| H01L 23/00 | (2006.01) | |
| H01L 21/66 | (2006.01) | |
| H01L 25/18 | (2023.01) | |
| H01L 25/00 | (2006.01) | |

(52) U.S. Cl.
CPC .............. *H01L 24/08* (2013.01); *H01L 22/20* (2013.01); *H01L 24/80* (2013.01);
(Continued)

(58) Field of Classification Search
CPC ..... H01L 24/08; H01L 24/80; H01L 25/0657; H01L 2224/08145; H01L 2224/80895;
(Continued)

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |

(Continued)

FOREIGN PATENT DOCUMENTS

| | | |
|---|---|---|
| CN | 103377961 A | 10/2013 |
| CN | 110537259 A | 12/2019 |

OTHER PUBLICATIONS

Extended European Search Report dated Jan. 28, 2022 for corresponding European Application No. 21190916.3.

*Primary Examiner* — Thanh Y. Tran

(74) *Attorney, Agent, or Firm* — Harness, Dickey & Pierce, P.L.C.

(57) ABSTRACT

A memory device includes a memory chip including a memory cell array connected to first word lines and first bit lines, first word line bonding pads respectively connected to the first word lines, and first bit line bonding pads respectively connected to the first bit lines, and a peripheral circuit chip, wherein the peripheral circuit chip includes a test cell array connected to second word lines and second bit lines, second word line bonding pads respectively connected to the first word line bonding pads, second bit line bonding pads respectively connected to the first bit line bonding pads, and a peripheral circuit connected to the second word line bonding pads and the second word lines or the second bit line bonding pads and the second bit lines.

20 Claims, 19 Drawing Sheets

(52) U.S. Cl.
CPC .......... *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2224/80908* (2013.01); *H01L 2225/06596* (2013.01); *H01L 2924/1431* (2013.01); *H01L 2924/14511* (2013.01)

(58) Field of Classification Search
CPC ... H01L 2225/06596; H01L 2924/1431; H01L 2924/14511
See application file for complete search history.

(56) References Cited

U.S. PATENT DOCUMENTS

| | | |
|---|---|---|
| 8,559,235 B2 | 10/2013 | Yoon et al. |
| 8,654,587 B2 | 2/2014 | Yoon et al. |
| 10,026,747 B2 | 7/2018 | Hwang et al. |
| 10,607,843 B2 | 3/2020 | Watanabe et al. |
| 10,622,372 B2 | 4/2020 | Hishida et al. |
| 10,679,721 B2 | 6/2020 | Kim et al. |
| 10,768,222 B1 | 9/2020 | Brozek |
| 2011/0233648 A1 | 9/2011 | Seol et al. |
| 2017/0053923 A1* | 2/2017 | Hwang .............. H01L 27/11582 |
| 2019/0081053 A1 | 3/2019 | Nojima et al. |
| 2019/0221557 A1 | 7/2019 | Kim et al. |
| 2019/0371812 A1 | 12/2019 | Oike |
| 2020/0013787 A1 | 1/2020 | Lee et al. |
| 2020/0035284 A1 | 1/2020 | Mahatme et al. |
| 2020/0152573 A1 | 5/2020 | Oh et al. |
| 2021/0066277 A1 | 3/2021 | Kim et al. |
| 2021/0066280 A1* | 3/2021 | Park ................... H01L 27/11582 |
| 2021/0124679 A1* | 4/2021 | Kim ...................... G06F 12/123 |

* cited by examiner

MEMORY DEVICE INCLUDING MEMORY CHIP AND PERIPHERAL MEMORY CHIP AND METHOD OF MANUFACTURING THE MEMORY DEVICE

CROSS-REFERENCE TO RELATED APPLICATION

This application is based on and claims priority under 35 U.S.C. § 119 to Korean Patent Application No. 10-2020-0155424, filed on Nov. 19, 2020, in the Korean Intellectual Property Office, the disclosure of which is incorporated by reference herein in its entirety.

BACKGROUND

The inventive concepts relates to a memory device, and more particularly, to a memory device including a memory chip and a peripheral circuit chip and a method of manufacturing the memory device.

Recently, with information technology devices becoming multifunctional, high capacity and high integration of memory devices are required. To this end, memory devices including a three-dimensional (3D) memory cell array including a plurality of memory cells respectively connected to word lines stacked in a direction perpendicular to a substrate, have been developed. Also, various memory devices in which a 3D memory cell array and a peripheral circuit are arranged in a vertical direction have been developed, and accordingly, the memory devices including the 3D memory cell array may have reduced sizes.

SUMMARY

According to some example embodiments of the inventive concepts, a memory device may include a memory chip including a memory cell array connected to first word lines and first bit lines, first word line bonding pads respectively connected to the first word lines, and first bit line bonding pads respectively connected to the first bit lines. The memory device may include a peripheral circuit chip, wherein the peripheral circuit chip includes a test cell array connected to second word lines and second bit lines, second word line bonding pads respectively connected to the first word line bonding pads, second bit line bonding pads respectively connected to the first bit line bonding pads, and a peripheral circuit connected to the second word line bonding pads and the second word lines or the second bit line bonding pads and the second bit lines.

According to some example embodiments of the inventive concepts, a memory device may include a memory chip including a memory cell array and a first bonding pad, wherein the memory cell array includes a plurality of memory blocks each including a plurality of vertical NAND strings, and a peripheral circuit chip including a test cell array including at least one test block including a plurality of planar NAND strings, a peripheral circuit connected to the test cell array, and a second bonding pad and vertically connected to the memory chip via the first and second bonding pads.

According to some example embodiments of the inventive concepts, a method of manufacturing a memory device may include fabricating a memory chip including a three-dimensional (3D) cell array, fabricating a peripheral circuit chip including a two-dimensional (2D) cell array and a peripheral circuit connected to the 2D cell array, performing an electrical die sorting (EDS) process on the peripheral circuit chip to inspect whether or not the 2D cell array and the peripheral circuit electrically operate, and fabricating the memory device based on bonding the peripheral circuit chip to the memory chip, in response to a determination that the 2D cell array and the peripheral circuit electrically operate.

According to some example embodiments of the inventive concepts, a method of manufacturing a memory device may include preparing a peripheral circuit chip including a two-dimensional (2D) cell array including at least one information data block storing information data and a peripheral circuit connected to the 2D cell array, reading the information data based on performing an information data read (IDR) operation on the peripheral circuit chip, and fabricating the memory device based on bonding a memory chip including a three-dimensional (3D) cell array to the peripheral circuit chip, in response to a determination that the information data is valid information data.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, example embodiments are described in detail with reference to the accompanying drawings.

It will be understood that any of the operations in any of the methods as described herein may be included in any combination with any other operations of any of the methods according to any of the example embodiments and in any order.

Figure 1:
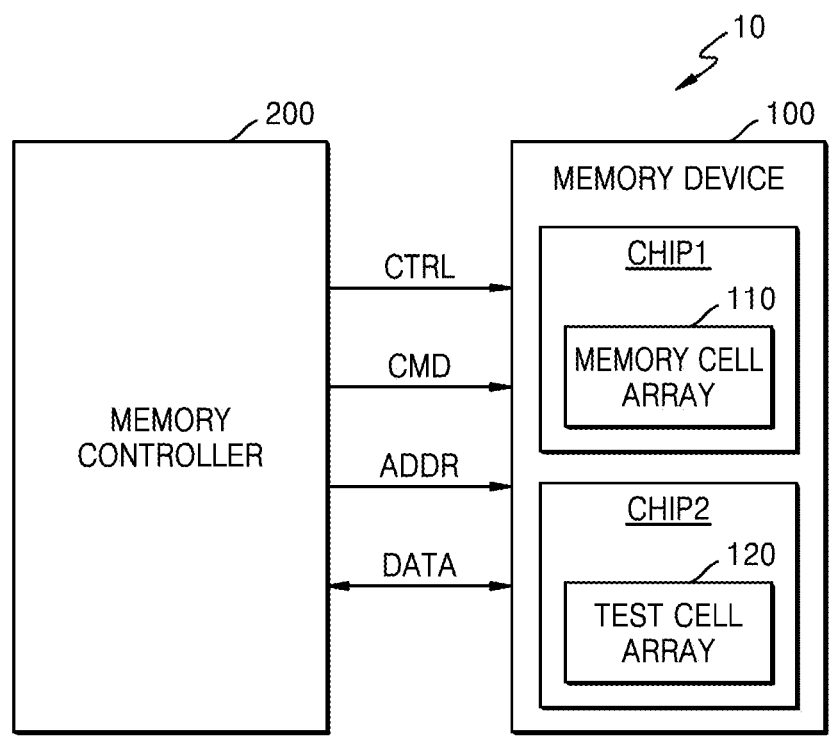
FIG. 1 is a block diagram of a memory system according to some example embodiments.

FIG. 1 is a block diagram of a memory system 10 according to some example embodiments.

Referring to FIG. 1, the memory system 10 may include a memory device 100 and a memory controller 200. For example, the memory system 10 may be included or mounted in electronic devices, such as a personal computer (PC), a server, a data center, a smartphone, a tablet PC, an autonomous vehicle, a portable game console, a wearable device, etc. For example, the memory system 10 may be realized as a storage device, such as a solid state drive (SSD).

The memory controller 200 may control general operations of the memory device 100. In detail, the memory controller 200 may control the memory device 100 by providing a control signal CTRL, a command CMD, and/or an address ADDR to the memory device 100. According to some example embodiments, the memory controller 200 may control the memory device 100 to store data DATA or output data DATA in response to a request of an external host.

The memory device 100 may include a memory chip CHIP1 and a peripheral circuit chip CHIP2, and the memory chip CHIP1 and the peripheral circuit chip CHIP2 may be connected to each other by a bonding manner. The memory device 100 may operate under control of the memory controller 200. According to some example embodiments, the memory device 100 may output stored data DATA under control of the memory controller 200 or store data DATA provided from the memory controller 200.

The memory chip CHIP1 may include a memory cell array 110, and the memory cell array 110 may include a plurality of memory blocks. Each memory block may include a plurality of vertical NAND strings (for example, NAND strings NS11 through NS33 of FIG. 4). Accordingly, the memory cell array 110 may be referred to as a "three-dimensional (3D) cell array" or a "3D memory cell array."

Each vertical NAND string may include memory cells respectively connected to word lines vertically stacked on a substrate. This aspect will be described in detail with reference to FIGS. 3 through 6. U.S. Pat. Nos. 7,679,133, 8,553,466, 8,654,587, 8,559,235, and No. 2011/0233648, the disclosures of which are herein incorporated in their entirety by reference, disclose appropriate configurations with respect to a 3D cell array formed as multiple levels sharing word lines and/or bit lines with one another other. Each memory cell may store one or more bits. In detail, each memory cell may be used as a single level cell (SLC), a multi-level cell (MLC), a triple level cell (TLC), or a quadruple level cell (QLC). One or more memory blocks of a plurality of memory blocks may include SLC blocks, and the others may include MLC, TLC, or QLC blocks.

The peripheral circuit chip CHIP2 may include a test cell array 120, and the test cell array 120 may include at least one test block. The at least one test block may include a plurality of planar NAND strings (for example, a NAND string NS of FIG. 7), and each planar NAND string may include a plurality of memory cells that are serially connected. Accordingly, the test cell array 120 may be referred to as a "two-dimensional (2D) cell array" or a "2D test cell array." Each memory cell may store one bit and may be used as an SLC. Also, the at least one test block may include an SLC block.

According to some example embodiments, the plurality of memory cells included in the memory cell array 110 and the test cell array 120 may include flash memory cells. However, the inventive concepts are not limited thereto, and the memory cells may include resistive random-access memory (RRAM) cells, ferroelectric random-access memory (FRAM) cells, phase-change random-access memory (PRAM) cells, thyristor random-access memory (TRAM) cells, magnetic random-access memory (MRAM) cells, or dynamic random-access memory (DRAM) cells. Hereinafter, embodiments of the inventive concepts will be described mainly based on embodiments in which the memory cells include NAND flash memory cells. According to some example embodiments, the test cell array 120 may include static random-access memory (SRAM), a logic gate, or the like.

Figure 2:
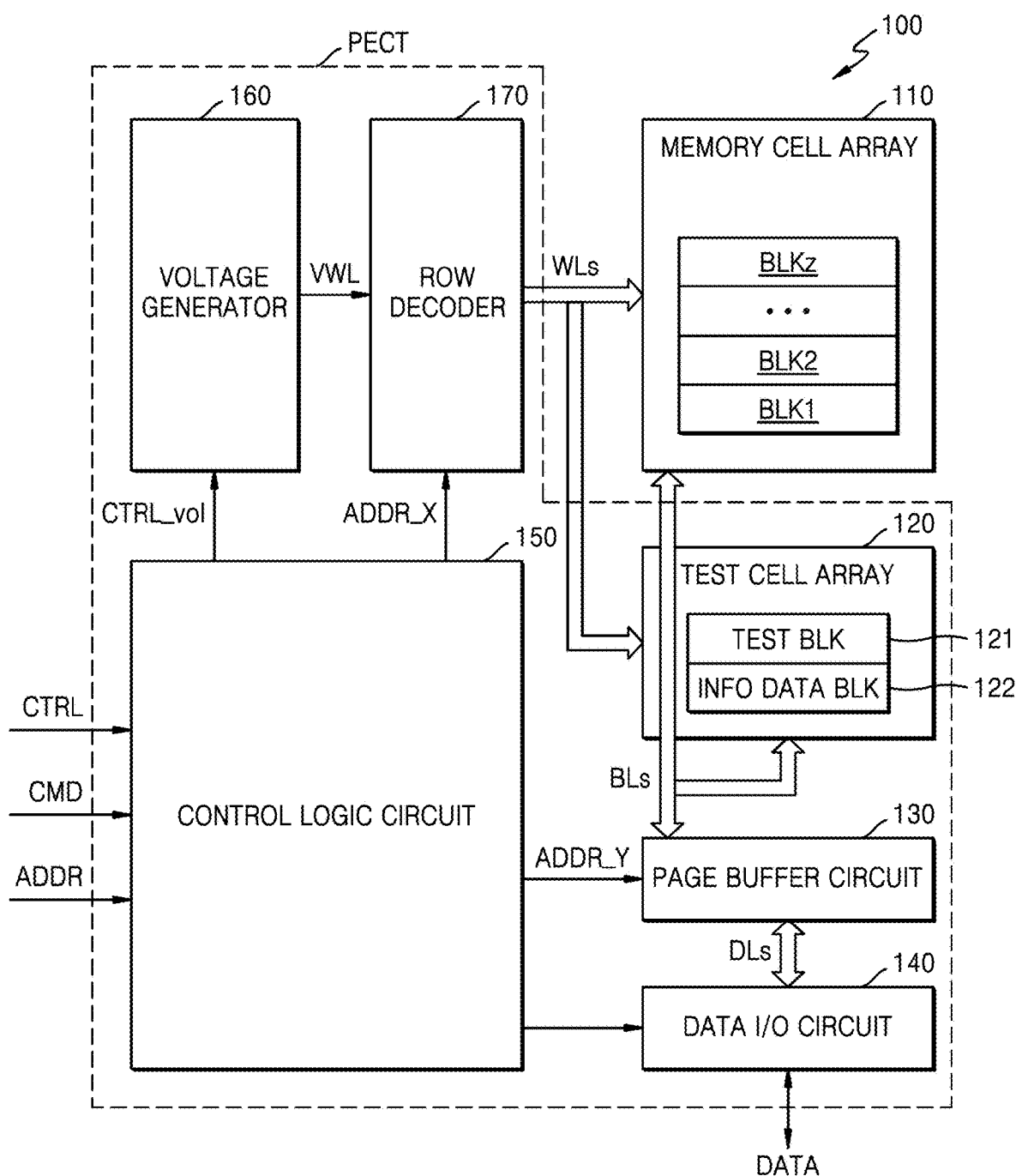
FIG. 2 is a block diagram of a memory device according to some example embodiments.

FIG. 2 is a block diagram of the memory device 100 according to some example embodiments.

Referring to FIGS. 1 and 2 together, the memory device 100 may include the memory cell array 110, the test cell array 120, a page buffer circuit 130, a data input-output circuit 140, a control logic circuit 150, a voltage generator 160, and a row decoder 170. According to some example embodiments, the memory cell array 110 may be arranged in the memory chip CHIP1, and the test cell array 120, the page buffer circuit 130, the data input-output circuit 140, the control logic circuit 150, the voltage generator 160, and the row decoder 170 may be arranged in the peripheral circuit chip CHIP2. According to some example embodiments, the test cell array 120, the page buffer circuit 130, the data input-output circuit 140, the control logic circuit 150, the voltage generator 160, and the row decoder 170 arranged in the peripheral circuit chip CHIP2 may be referred to as peripheral circuits PECT. According to some example embodiments, the memory device 100 may include a non-volatile memory device. Hereinafter, the "memory device" indicates a non-volatile memory device.

The memory cell array 110 may include a plurality of memory blocks BLK1 through BLKz (z is a positive integer), and each of the plurality of memory blocks BLK1 through BLKz may include a plurality of memory cells. The memory cell array 110 may be connected to the page buffer circuit 130 through bit lines BLs and to the row decoder 170 through word lines WLs.

The test cell array 120 may include at least one test block 121 (indicated as "TEST BLK" in the drawing). Also, the test cell array 120 may further include at least one information data block 122 (indicated as "INFO DATA BLK" in the drawing). The at least one test block 121 may include a plurality of test cells, and the at least one information data block 122 may include a plurality of memory cells each storing information data. The test cell array 120 may be connected to the page buffer circuit 130 through the bit lines BLs and to the row decoder 170 through the word lines WLs.

After the memory chip CHIP1 and the peripheral circuit chip CHIP2 are bonded to each other, the control logic circuit 150 may generate various control signals for programming data in the memory cell array 110, reading data from the memory cell array 110, or erasing data stored in the memory cell array 110, based on the command CMD, the address ADDR, and the control signal CTRL. For example, the control logic circuit 150 may output a row address X-ADDR (ADDR_X) and a column address Y-ADDR (ADDR_Y). By doing so, the control logic circuit 150 may generally control various operations in the memory device 100.

Before the memory chip CHIP1 and the peripheral circuit chip CHIP2 are bonded to each other, the control logic circuit 150 may generate various control signals for programming test data in the test cell array 120, reading test data from the test cell array 120, or erasing test data stored in the test cell array 120. For example, the control logic circuit 150 may output a row address X-ADDR and a column address Y-ADDR.

Before the memory chip CHIP1 and the peripheral circuit chip CHIP2 are bonded to each other, the control logic circuit 150 may program information data that is generated as a result of performing an electric die sorting (EDS) process (the peripheral circuit chip CHIP2 may be configured to perform), or configuration data in the information data block 122 of the test cell array 120. Here, the information data may be information required for initializing settings of the memory device 100. For example, the information data may include direct current (DC) trim information, option information, repair information, bad block information, bad column information, and the like. Also, for example, the information data may include a read voltage level, a pass voltage level, and the like during a data read operation.

Also, after the memory chip CHIP1 and the peripheral circuit chip CHIP2 are bonded to each other (e.g., in response to such bonding), when power is supplied to the memory device 100, the control logic circuit 150, and thus the memory chip CHIP1, may perform an information data read (IDR) operation on the test cell array 120 and on the information data block 122 to use information data stored in the information data block 122 in order to set various control signals or operating parameters for operations of the memory device 100. When the information data is not normally read, the memory device 100 may not normally perform programming and reading operations of user data.

The voltage generator 160 may generate various types of voltages for performing programming, reading, and erasing operations on the memory cell array 110 or the test cell array 120 based on a voltage control signal CTRL_vol. In detail, the voltage generator 160 may generate a word line voltage VWL, for example, a program voltage, a read voltage, a pass voltage, an erase verify voltage, a program verify voltage, or the like. Also, the voltage generator 160 may further generate a string select line voltage and a ground select line voltage based on the voltage control signal CTRL_vol.

The row decoder 170 may select one of the plurality of memory blocks BLK1 through BLKz, select one of the word lines WLs of the selected memory block, and select one of a plurality of string select lines SSLs, in response to the row address X-ADDR. Also, the row decoder 170 may select one of the at least one test block 121 and the at least one information data block 122, select one of the word lines WLs of the selected at least one test block 121 or the selected at least one information data block 122, and select one of the plurality of string select lines SSLs, in response to the row address X-ADDR.

The page buffer circuit 130 may be connected to the memory cell array 110 or the test cell array 120 through the plurality of bit lines BLs. The page buffer circuit 130 may be configured to temporarily store data DATA to program in the memory cell array 110 or the test cell array 120 or may be configured to temporarily store data DATA read from the memory cell array 110 or the test cell array 120. The data input-output circuit 140 may provide data DATA received from the memory controller 200 to the page buffer circuit 130 through data lines DLs or may provide data DATA received from the page buffer circuit 130 to the memory controller 200 through the data lines DLs. The data input-output circuit 140 may operate according to a control signal from the control logic circuit 150.

Figure 3:
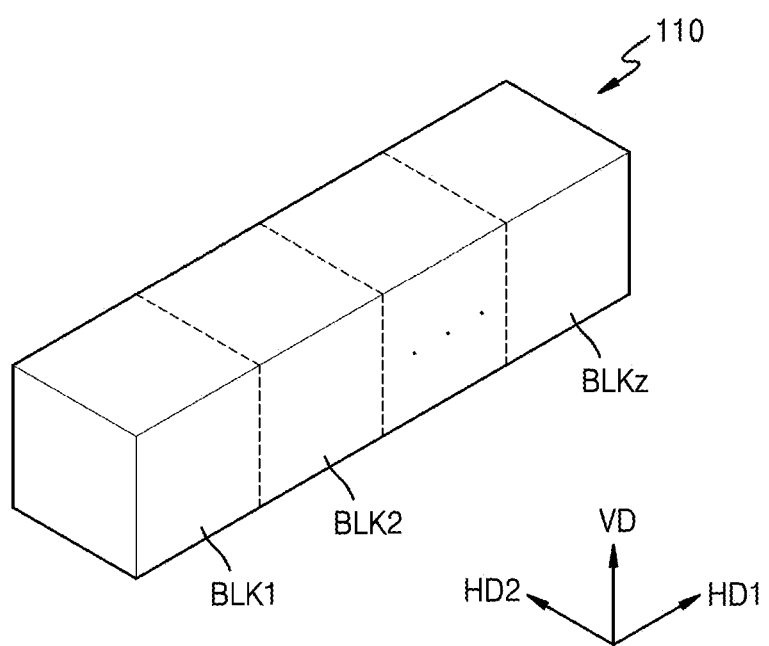
FIG. 3 illustrates a memory cell array according to some example embodiments.

FIG. 3 illustrates the memory cell array 110 according to some example embodiments.

Referring to FIG. 3, the memory cell array 110 may include the plurality of memory blocks BLK1 through BLKz (z may be a positive integer, e.g., any integer of 1 or greater). Each of the plurality of memory blocks BLK1 through BLKz may have a 3D structure (or a vertical structure). In detail, each of the plurality of memory blocks BLK1 through BLKz may include a plurality of NAND strings extending in a vertical direction VD. Here, the plurality of NAND strings may be provided to be apart from each other by a particular (or, alternatively, predetermined) distance in a first horizontal direction HD1 and a second horizontal direction HD2. The plurality of memory blocks BLK1 through BLKz may be selected by the row decoder 170 (see FIG. 2). For example, the row decoder 170 may select a memory block corresponding to a block address, from among the plurality of memory blocks BLK1 through BLKz.

Figure 4:
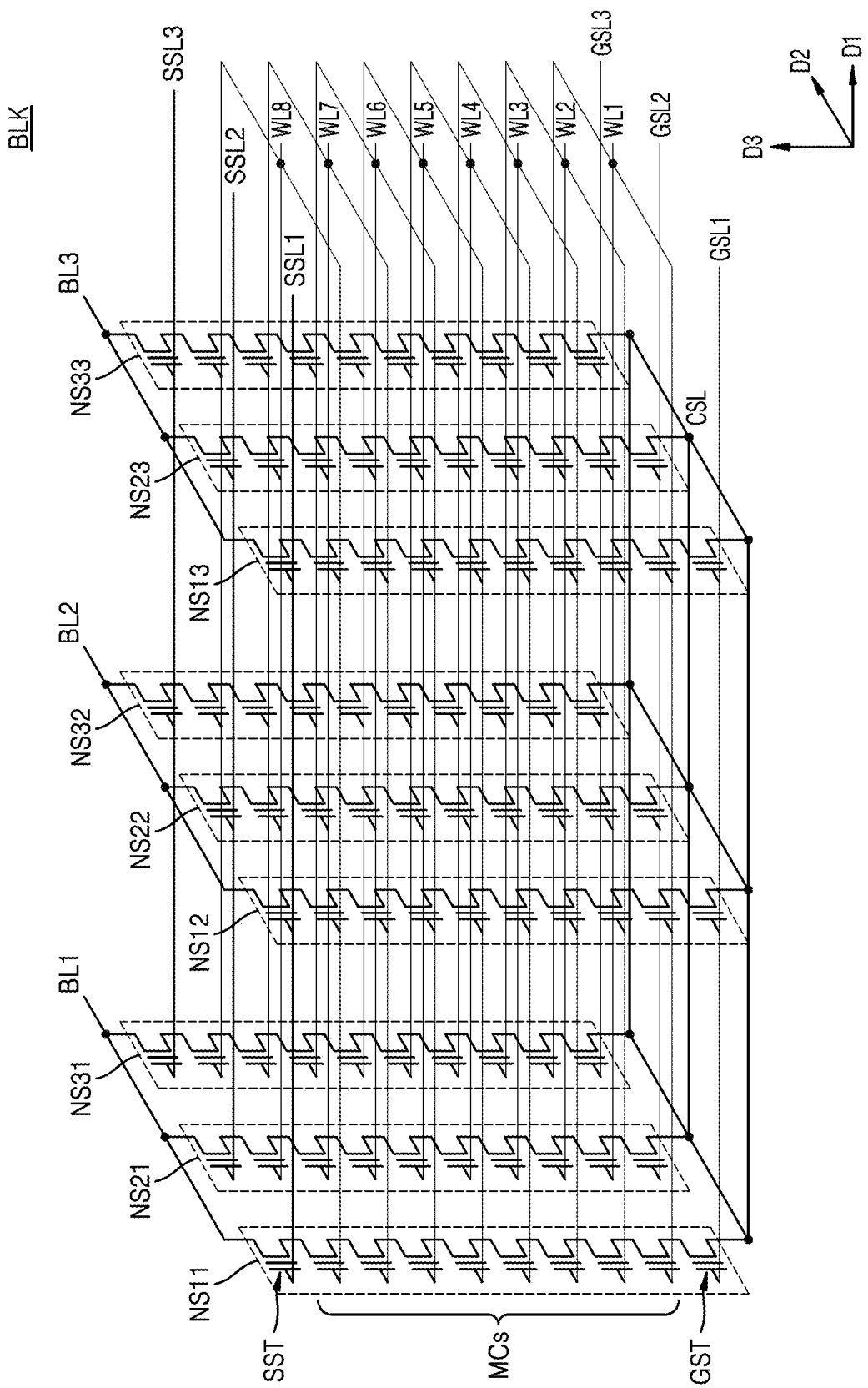
FIG. 4 is a circuit diagram of a memory block according to some example embodiments.

FIG. 4 is a circuit diagram of a memory block BLK according to some example embodiments.

Referring to FIG. 4, the memory block BLK may correspond to one of the plurality of memory blocks BLK1 through BLKz of FIG. 3. The memory block BLK may include NAND strings NS11 through NS33, and each NAND string (for example, the NAND string NS11) may include a string select transistor SST, a plurality of memory cells MCs, and a ground select transistor GST that are serially connected. The string select transistor SST, the ground select transistor GST, and the memory cells MCs included in each NAND string may form a structure in which the string select transistor SST, the ground select transistor GST, and the memory cells MCs are stacked on a substrate in a vertical direction.

Word lines, namely, first through eighth word lines WL1 through WL8, may extend in the second horizontal direction HD2 (see FIG. 3), and bit lines, namely, first through third bit lines BL1 through BL3, may extend in the first horizontal direction HD1 (see FIG. 3). The NAND strings NS11, NS21, and NS31 may be between the first bit line BL1 and a common source line CSL, the NAND strings NS12, NS22, and NS32 may be between the second bit line BL2 and the common source line CSL, and the NAND strings NS13, NS23, and NS33 may be between the third bit line BL3 and the common source line CSL. The string select transistor SST may be connected to each of string select lines SSL1 through SSL3 corresponding to the string select transistor SST. The memory cells MCs may be respectively connected to the word lines (for example, the first through eighth word lines WL1 through WL8) corresponding to the memory cells MCs. The ground select transistor GST may be connected to each of ground select lines GSL1 through GSL3 corresponding to the ground select transistor GST. The string select transistor SST may be connected to each of the bit lines (for example, the first through third bit lines BL1 through BL3) corresponding to the string select transistor SST, and the ground select transistor GST may be connected to the common source line CSL. Here, the number of NAND strings, the number of word lines, the number of bit lines, the number of ground select lines, and the number of string select lines may be variously modified according to some example embodiments.

Figure 5:
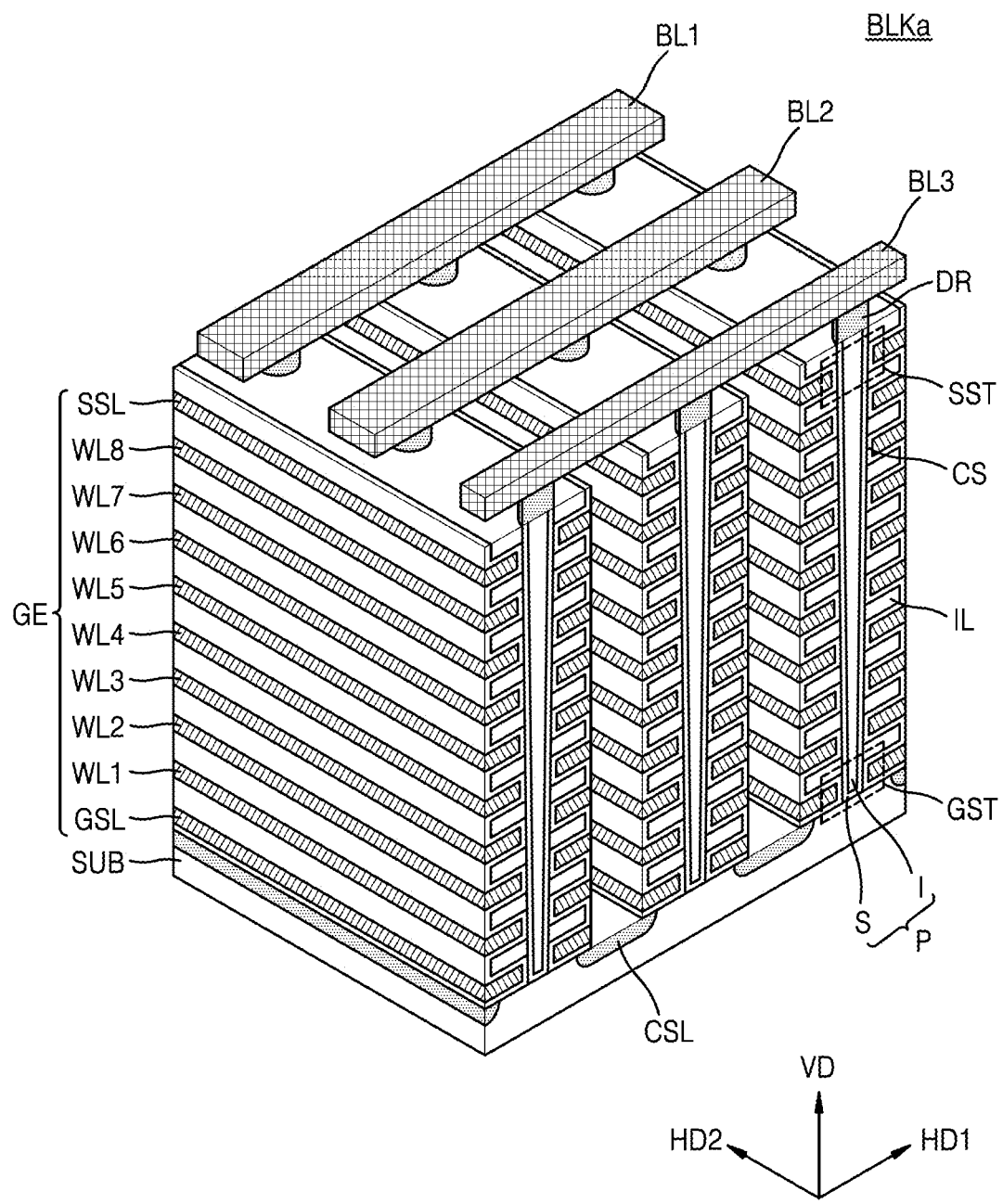
FIGS. 5 and 6 are perspective views of memory blocks according to some example embodiments.

FIG. 5 is a perspective view of a memory block BLKa according to some example embodiments.

Referring to FIG. 5, the memory block BLKa may correspond to one of the plurality of memory blocks BLK1 through BLKz of FIG. 2. The memory block BLKa may be formed in a vertical direction (VD) perpendicular to a substrate SUB. The substrate SUB may have a first conductive-type (for example, a p-type), and the common source line CSL doped with impurities of a second conductive-type (for example, an n-type) may extend on the substrate SUB in a second horizontal direction HD2. A plurality of insulating layers IL extending in the second horizontal direction HD2 may be sequentially provided on the substrate SUB in the vertical direction VD, between two adjacent common source lines CSL, wherein the plurality of insulating layers IL may be apart from each other by a particular (or, alternatively, predetermined) distance in the vertical direction VD. For example, the plurality of insulating layers IL may include an insulating material, such as silicon oxide.

A plurality of pillars P may be provided on the substrate SUB between two adjacent common source lines CSL to be sequentially arranged in the first horizontal direction HD1 and to penetrate the plurality of insulating layers IL in the vertical direction VD. For example, the plurality of pillars P may penetrate the plurality of insulating layers IL and contact the substrate SUB. In detail, a surface layer S of each pillar P may include a silicon material having a first conductive type and may function as a channel region. An inner layer I of each pillar P may include an insulating material such as silicon oxide or an air gap.

A charge storage layer CS may be provided between two adjacent common source lines CSL along the insulating layers IL, the pillars P, and an exposed surface of the substrate SUB. The charge storage layer CS may include a gate insulating layer (or referred to as a "tunneling insulating layer"), a charge trap layer, and a blocking insulating layer. For example, the charge storage layer CS may have an oxide-nitride-oxide (ONO) structure. Also, a gate electrode GE, such as the string and ground select lines SSLs and GSLs and the word lines WL1 through WL8, may be provided on an exposed surface of the charge storage layer CS between two adjacent common source lines CSL.

Drains or drain contacts DR may be provided on the plurality of pillars P, respectively. For example, the drains or the drain contacts DR may include a silicon material doped with impurities having a second conductive type. The bit lines BL1 through BL3 may be provided on the drains DR to extend in the first horizontal direction HD1 and to be apart from each other in the second horizontal direction HD2 by a particular (or, alternatively, predetermined) distance.

Figure 6:
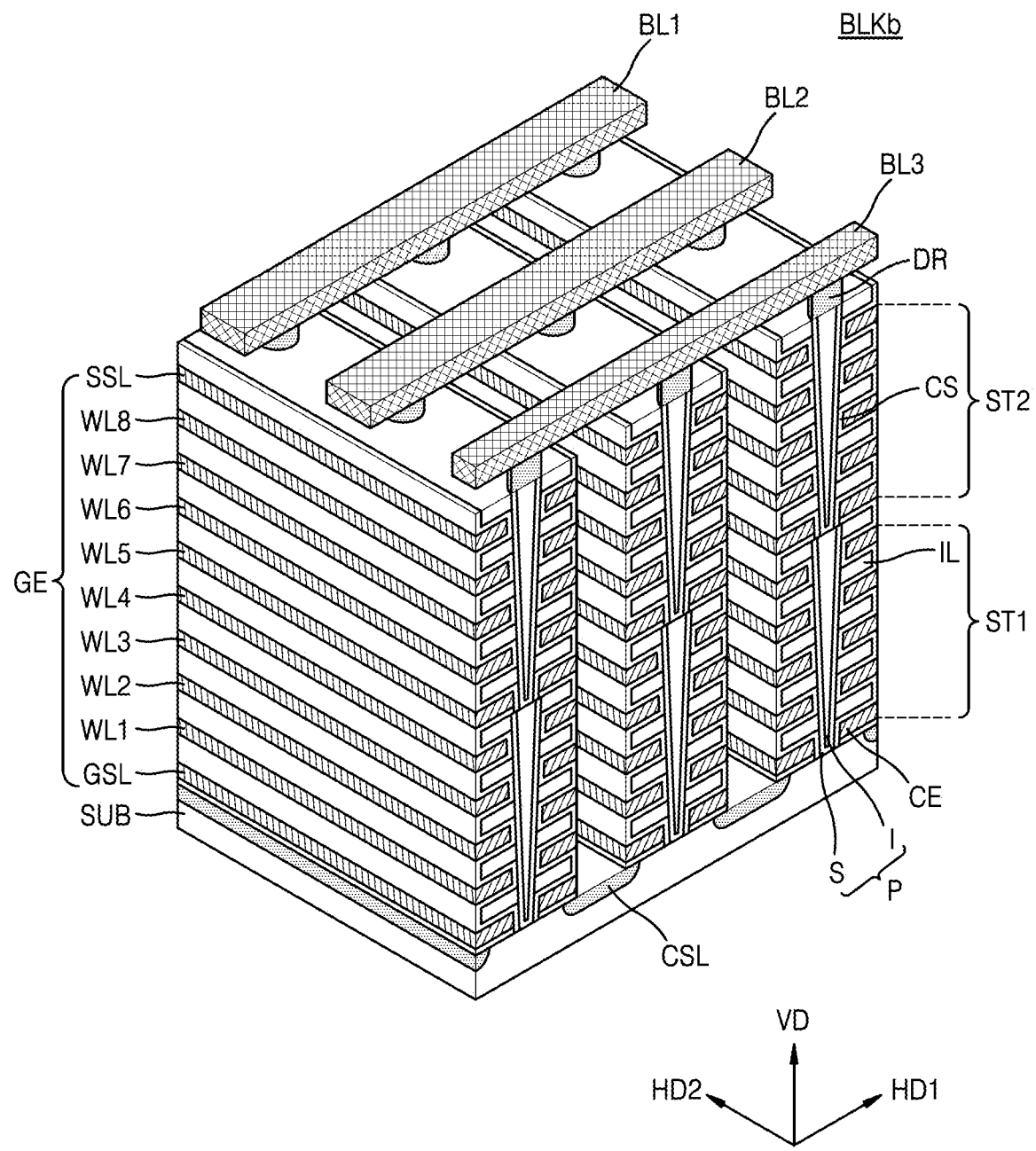

FIG. 6 is a perspective view of a memory block BLKb according to some example embodiments.

Referring to FIG. 6, the memory block BLKb may correspond to one of the plurality of memory blocks BLK1 through BLKz of FIG. 2. Also, the memory block BLKb may correspond to a modified example of the memory block BLKa of FIG. 5, and aspects described above with reference to FIG. 5 may be applied in some example embodiments. The memory block BLKb may be formed in a direction perpendicular to a substrate SUB. The memory block BLKb may include a first memory stack ST1 and a second memory stack ST2 that are stacked in a vertical direction VD.

Figure 7:
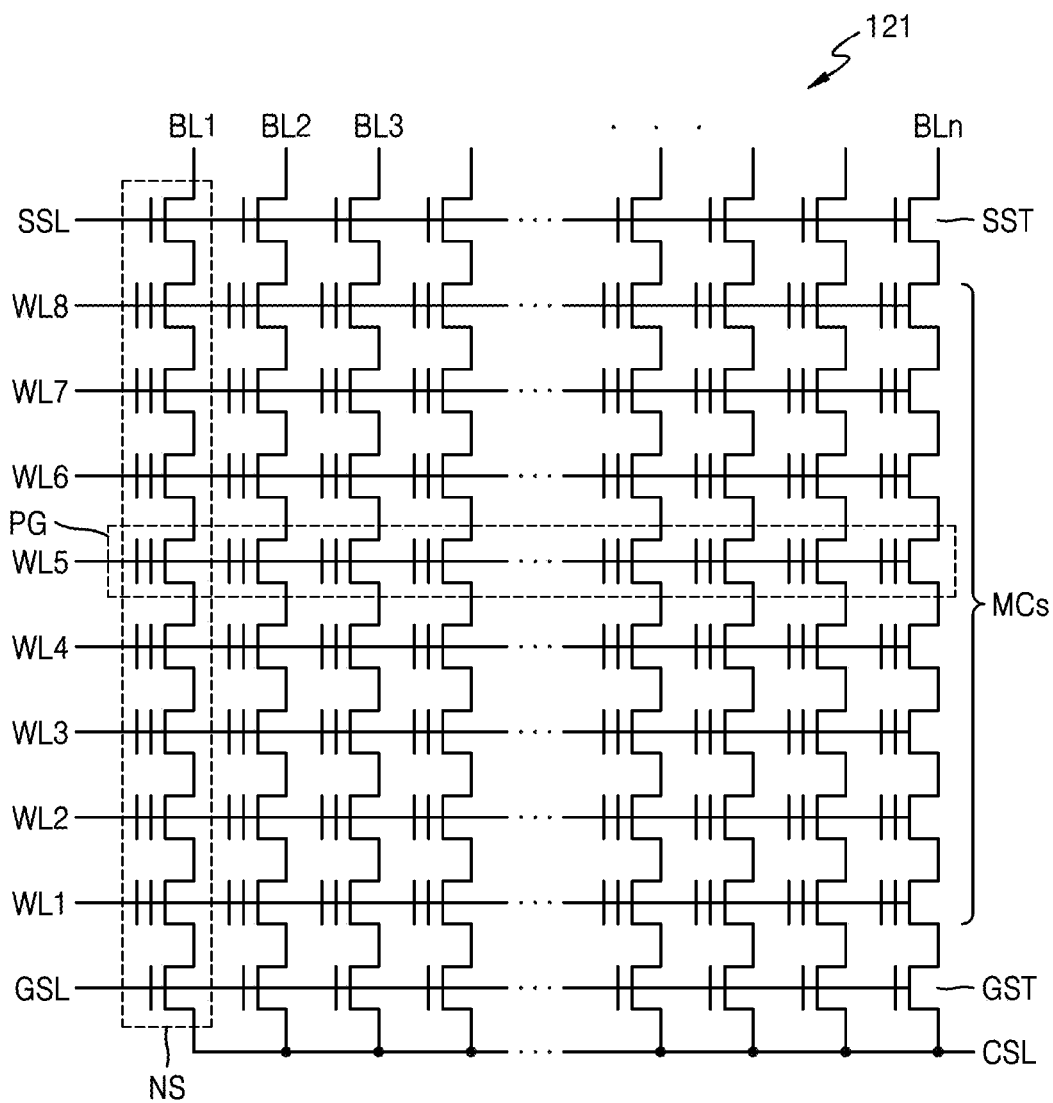
FIG. 7 is a circuit diagram of a test block according to some example embodiments.

FIG. 7 is a circuit diagram of the test block 121 according to some example embodiments.

Referring to FIG. 7, the test block 121 may correspond to the at least one test block 121 of FIG. 2 and may include a plurality of NAND strings NSs. For example, the NAND string NS may include a string select transistor SST, a plurality of memory cells MCs, and a ground select transistor GST connected in series between a bit line BL1 and a common source line CSL. The string select transistor SST, the plurality of memory cells MCs, and the ground select transistor GST included in the NAND string NS may be formed on a substrate in a horizontal direction. Word lines WL1 through WL8 may extend in a second horizontal direction, and bit lines BL1 through BLn (n being any positive integer) may extend in a first horizontal direction. According to some example embodiments, the information data block 122 may also have a structure as illustrated in FIG. 7. As shown, the test block 121 may include an element PG which may include a plurality of memory cells MC connected in parallel to common source line CSL and connected to a same word line (e.g., WL5).

Figure 8:
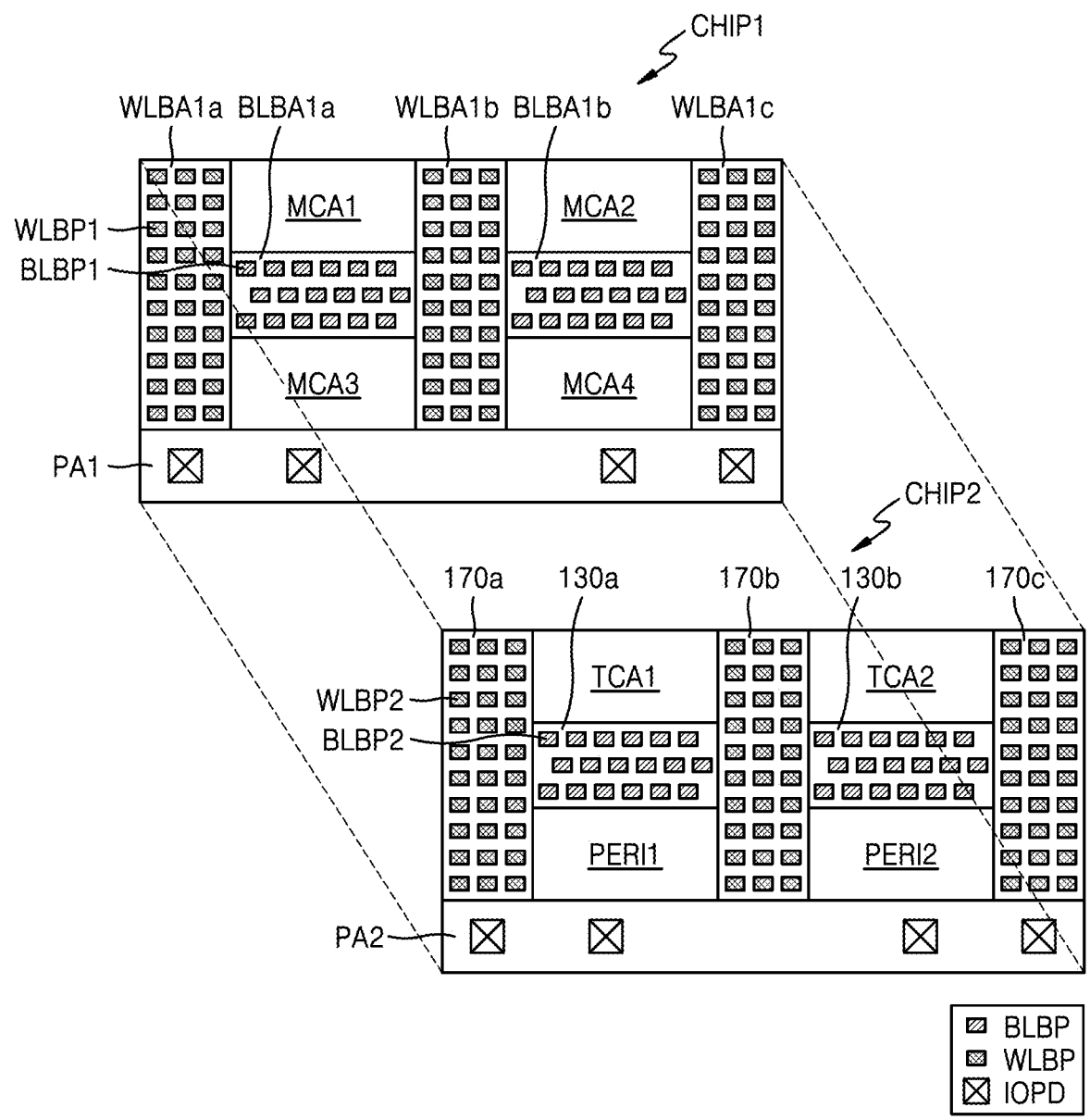
FIG. 8 illustrates a memory chip and a peripheral circuit chip according to some example embodiments.

FIG. 8 illustrates the memory chip CHIP1 and the peripheral circuit chip CHIP2 according to some example embodiments.

Referring to FIG. 8, an upper chip or the memory chip CHIP1 may be formed on a first wafer, a lower chip or the peripheral circuit chip CHIP2 may be formed on a second wafer, and the memory chip CHIP1 and the peripheral circuit chip CHIP2 may be connected to each other by a bonding manner. In detail, the memory chip CHIP1 and the peripheral circuit chip CHIP2 may be connected to each other in a vertical direction by a plurality of bonding pads including word line bonding pads WLBP and bit line bonding pads BLBP. For example, the peripheral circuit chip CHIP2 may be vertically connected to the memory chip CHIP1 via the first and second word line bonding pads WLBP1 and WLBP2 and the first and second bit line bonding pads BLBP1 and BLBP2. The first and second word line bonding pads WLBP1 and WLBP2 may be connected to each other based on a bonding manner, and the first and second bit line bonding pads BLBP1 and BLBP2 may be connected to each other based on the bonding manner.

The memory chip CHIP1 may include first through fourth memory cell arrays MCA1 through MCA4, a plurality of word line bonding areas WLBA1a, WLBA1b, and WLBA1c, a plurality of bit line bonding areas BLBA1a and BLBA1b, and a first external pad bonding area PA1. Each of the first through fourth memory cell arrays MCA1 through MCA4 may include a plurality of memory blocks and may be connected to first word lines and first bit lines.

A plurality of first word line bonding pads WLBP1 may be arranged in each of the plurality of word line bonding areas WLBA1a, WLBA1b, and WLBA1c. The plurality of first word line bonding pads WLBP1 may be connected to the first word lines that are connected to one or more of the memory cell arrays MCA1 to MCA4, respectively. A plurality of first bit line bonding pads BLBP1 may be arranged in each of the plurality of bit line bonding areas BLBA1a and BLBA1b. The plurality of first bit line bonding pads BLBP1 may be connected to the first bit lines that are connected to one or more of the memory cell arrays MCA1 to MCA4, respectively. A plurality of input-output pads IOPD may be arranged in a first external pad bonding area PA1.

The peripheral circuit chip CHIP2 may include first and second test cell arrays TCA1 and TCA2, a plurality of row decoders 170a, 170b, and 170c, a plurality of page buffers 130a and 130b, first and second peripheral circuits PERI1 and PERI2, and a second external pad bonding area PA2. Each of the first test cell array TCA1 and the second test cell array TCA2 may include a plurality of memory blocks and may be connected to second word lines and second bit lines. Here, the memory blocks included in each of the first test cell array TCA1 and the second test cell array TCA2 may include at least one test block and at least one information data block. For example, the first and second test cell arrays TCA1 and TCA2 may correspond to the test cell array 120 of FIG. 2, the plurality of row decoders 170a, 170b, and 170c may correspond to the row decoder 170 of FIG. 2, and the plurality of page buffers 130a and 130b may correspond to the page buffer circuit 130 of FIG. 2. For example, the first and second peripheral circuits PERI1 and PERU may include the control logic circuit 150, the voltage generator 160, and the like of FIG. 2.

According to some example embodiments, the first and second test cell arrays TCA1 and TCA2 may be arranged in areas corresponding to the first and second memory cell arrays MCA1 and MCA2, respectively, and the first and second peripheral circuits PERI1 and PERI2 may be arranged in areas corresponding to the third and fourth memory cell arrays MCA3 and MCA4, respectively. According to some example embodiments, the plurality of row decoders 170a, 170b, and 170c may be arranged in areas corresponding to the plurality of word line bonding areas WLBA1a, WLBA1b, and WLBA1c, respectively, and the plurality of page buffers 130a and 130b may be arranged in areas corresponding to the plurality of bit line bonding areas BLBA1a and BLBA1b, respectively.

A plurality of second word line bonding pads WLBP2 of the peripheral circuit chip CHIP2 may be arranged in each of the plurality of row decoders 170a, 170b, and 170c and may be respectively connected to the first word line bonding pads WLBP1 of the memory chip CHIP1. The second word line bonding pads WLBP2 may be respectively connected to second word lines that are connected to one or more of the test cell arrays TCA1 to TCA2. The second bit line bonding pads BLBP2 may be respectively connected to second bit lines that are connected to one or more of the test cell arrays TCA1 to TCA2. Via the plurality of first word line bonding pads WLBP1 and the plurality of second word line bonding pads WLBP2, the plurality of row decoders 170a, 170b, and 170c may be connected to the first through fourth memory cell arrays MCA1 through MCA4. Also, the plurality of row decoders 170a, 170b, and 170c may be connected to the first and second test cell arrays TCA1 and TCA2 via inner lines of the peripheral circuit chip CHIP2. The peripheral circuit chip CHIP2 (e.g., the peripheral circuit PERI1 and/or PERU) may include a row decoder connected to one or more memory cell arrays MCA1 to MCA4 through the first and second word line bonding pads WLBP1 and WLBP2 and the first word lines and connected to one or more test cell arrays TCA1 and/or TCA2 through the second word lines.

A plurality of second bit line bonding pads BLBP2 of the peripheral circuit chip CHIP2 may be arranged in each of the plurality of page buffers 130a and 130b and may be respectively connected to the first bit line bonding pads BLBP1 of the memory chip CHIP1. Via the plurality of first bit line bonding pads BLBP1 and the plurality of second bit line bonding pads BLBP2, the plurality of page buffers 130a and 130b may be connected to the first through fourth memory cell arrays MCA1 through MCA4. Also, the plurality of page buffers 130a and 130b may be connected to the first and second test cell arrays TCA1 and TCA2 via the inner lines of the peripheral circuit chip CHIP2. The plurality of input-output pads IOPD may be arranged in the second external pad bonding area PA2. The peripheral circuit chip CHIP2 (e.g., the peripheral circuit PERI1 and/or PERI2) may include a page buffer connected to one or more memory cell arrays MCA1 to MCA2 through the first and second bit line bonding pads BLBP1 and/or BLBP2 and the first bit lines and connected to one or more test cell arrays TCA1 and/or TCA2 through the second bit lines.

The first and second peripheral circuits PERIL and PERU may be connected to at least some of the second word line bonding pads WLBP2 and the second word lines or at least some of the second bit line bonding pads BLBP2 and the second bit lines. The first and second peripheral circuits PERI1 and PERI2 may be connected to one or more test arrays MCA1 to MCA4.

In some example embodiments, the first and second word line bonding pads WLBP1 and WLBP2 and the first and second bit line bonding pads BLBP1 and BLBP2 include copper.

Figure 9:
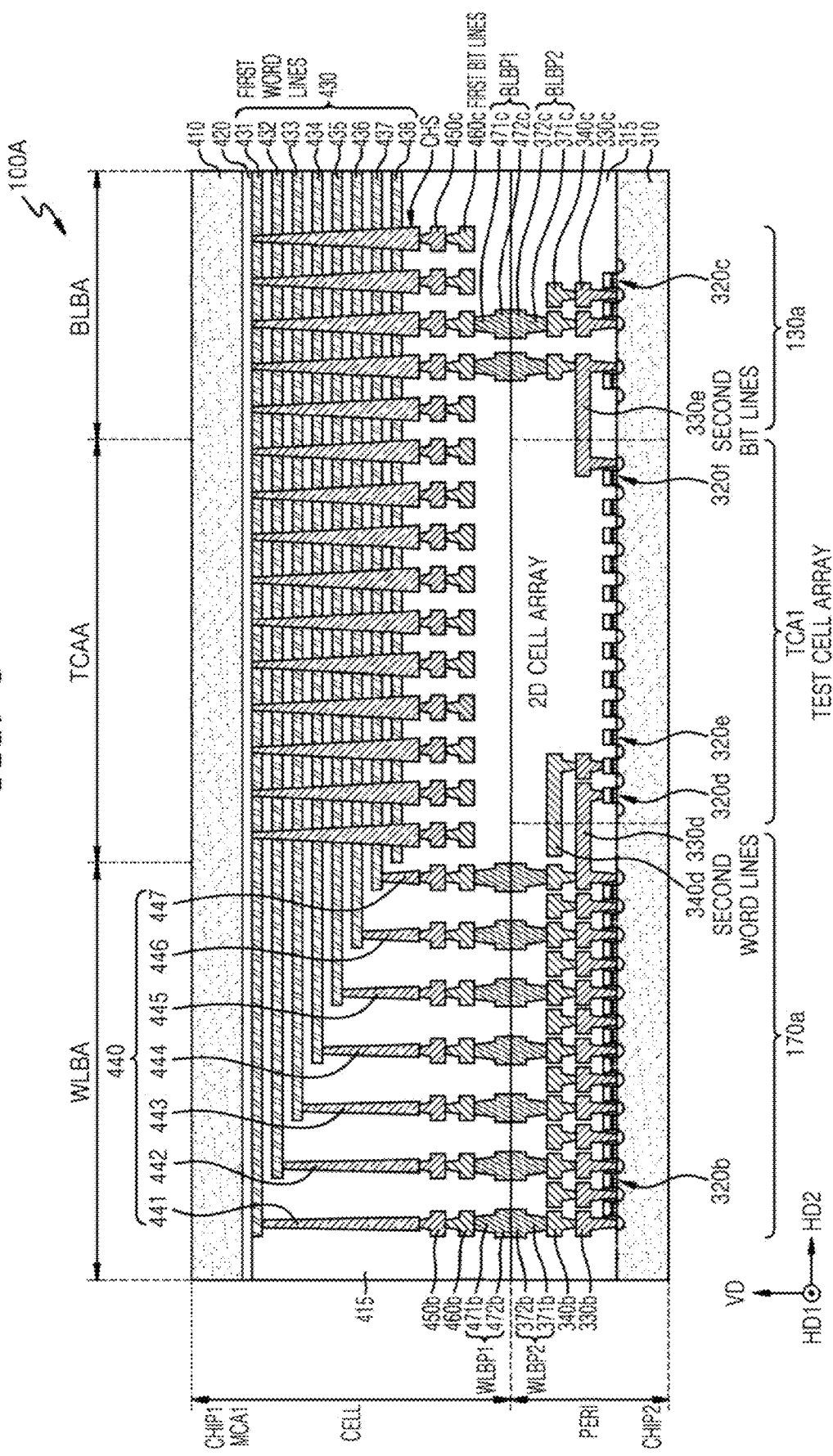
FIG. 9 is a cross-sectional view of a memory device according to some example embodiments.

FIG. 9 is a cross-sectional view of a memory device 100A according to some example embodiments.

Referring to FIGS. 8 and 9, the memory device 100A may correspond to an example of the memory device 100 of FIG. 1. The aspects described above with reference to FIGS. 1 through 8 may be applied to some example embodiments. The memory device 100A may include the cell region CELL and the peripheral circuit region PERI. The cell region CELL may be an upper chip or the memory chip CHIP1, the peripheral circuit region PERI may be a lower chip or the peripheral circuit chip CHIP2, and the memory device 100A may have a chip-to-chip (C2C) structure.

Each of the cell region CELL and the peripheral circuit region PERI may include a word line bonding area WLBA, a bit line bonding area BLBA, and a test cell array area TCAA. The peripheral circuit region PERI may include a first substrate 310, an interlayer insulating layer 315, a plurality of circuit elements 320b through 320f formed in the first substrate 310, first metal layers 330b, 330c, and 330d connected to the plurality of circuit elements 320b through 320f, respectively, and second metal layers 340b, 340c, and 340d formed on the first metal layers 330b, 330c, 330d, and 330e. The interlayer insulating layer 315 may be arranged on the first substrate 310 to cover the plurality of circuit elements 320b though 320f, the first metal layers 330b, 330c, 330d and 330e, and the second metal layers 340b, 340c, and 340d and may include an insulating material, such as silicon oxide, silicon nitride, and the like.

Lower bonding metals 371b and 372b may be formed on the second metal layer 340b in the word line bonding area WLBA. In the word line bonding area WLBA, the lower bonding metals 371b and 372b of the peripheral circuit region PERI and upper bonding metals 471b and 472b of the cell region CELL may be bonded to be electrically connected to each other, and the lower bonding metals 371b and 372b and the upper bonding metals 471b and 472b may include aluminum, copper, tungsten, or the like. The upper bonding metals 471b and 472b of the cell region CELL may be referred to as the "first word line bonding pads WLBP1," and the lower bonding metals 371b and 372b of the peripheral circuit region PERI may be referred to as the "second word line bonding pads WLBP2."

The cell region CELL may provide at least one memory block. The cell region CELL may include a second substrate 410 and a common source line 420. A plurality of word lines 430, namely, first through eighth word lines 431 through 438, may be stacked on the second substrate 410 in a vertical direction VD perpendicular with respect to an upper surface of the second substrate 410. String select lines and ground select lines may be arranged above and below the word lines 430, respectively, and the plurality of word lines 430 may be arranged between the string select lines and the ground select lines.

In the test cell array area TCAA and the bit line bonding area BLBA, a channel structure CHS may extend in the vertical direction VD with respect to the upper surface of the second substrate 410 and may penetrate the word lines 430, the string select lines, and the ground select lines. The channel structure CHS may include a data storage layer, a channel layer, a buried insulating layer, and the like, and the channel layer may be electrically connected to a first metal layer 450c and a second metal layer 460c. For example, the first metal layer 450c may include a bit line contact, and the second metal layer 460c may include (and may be referred to herein interchangeably as) a bit line. According to some example embodiments, the bit line 460c may extend in a first horizontal direction HD1 that is parallel to the upper surface of the second substrate 410.

The bit line 460c may be electrically connected to the circuit elements 320c providing the page buffer 130a in the peripheral circuit region PERI. For example, the bit line 460c may be connected to upper bonding metals 471c and 472c in the peripheral circuit region PERI, and the upper bonding metals 471c and 472c may be connected to lower bonding metals 371c and 372c connected to the circuit elements 320c of the page buffer 130a. The upper bonding metals 471c and 472c of the cell region CELL may also be referred to as the "first bit line bonding pads BLBP1," and the lower bonding metals 371c and 372c of the peripheral circuit region PERI may also be referred to as the "second bit line bonding pads BLBP2."

In the word line bonding area WLBA, the word lines 430 may extend in a second horizontal direction HD2 that is parallel to the upper surface of the second substrate 410 and may be connected to a plurality of cell contact plugs 440, namely, first through seventh cell contact plugs 441 through 447. The word lines 430 and the cell contact plugs 440 may be connected to each other at pads provided by one or more word lines from among the word lines 430, the one or more word lines extending in the second horizontal direction HD2 in different lengths from one another. A first metal layer 450b and a second metal layer 460b may be sequentially connected above the cell contact plugs 440 connected to the word lines 430. The cell contact plugs 440 may be connected to the peripheral circuit region PERI in the word line bonding area WLBA through the upper bonding metals 471b and 472b of the cell region CELL and the lower bonding metals 371b and 372b of the peripheral circuit region PERI.

The cell contact plugs 440 may be electrically connected to the circuit elements 320b providing the row decoder 170a in the peripheral circuit region PERI. According to some example embodiments, an operating voltage of the circuit elements 320b providing the row decoder 170a may be different from an operating voltage of the circuit elements 320c providing the page buffer 130a. For example, the operating voltage of the circuit elements 320c providing the page buffer 130a may be greater than the operating voltage of the circuit elements 320b providing the row decoder 170a.

A first test cell array TCA1 may be arranged in the test cell array area TCAA of the peripheral circuit region PERI. The first test cell array TCA1 may include a 2D cell array and may include the plurality of circuit elements 320d, 320e, and 320f arranged in the second horizontal direction HD2. The plurality of circuit elements 320d, 320e, and 320f may be connected in series to form a NAND string (for example, the NAND string NS of FIG. 7).

For example, the circuit element 320d may correspond to a ground select transistor (for example, the ground select transistor GST of FIG. 7), the circuit elements 320e may correspond to memory cells (for example, the memory cells MCs of FIG. 7), and the circuit element 320f may correspond to a string select transistor (for example, the string select transistor SST of FIG. 7). For example, the first metal layer 330d may correspond to a ground select line (for example, the ground select line GSL of FIG. 7), the first metal layer 330e may correspond to a bit line (for example, the bit line BL1 of FIG. 7), and the second metal layer 340d may correspond to a word line (for example, the word line WL1 of FIG. 7).

As described above, the first test cell array TCA1 may be connected to the row decoder 170a through the first metal layer 330d and the second metal layer 340d and may be connected to the page buffer 130a through the first metal layer 330e and the second metal layer 340c. Also, a memory cell array arranged in the cell region CELL may be connected to the row decoder 170a through the first word line bonding pads, that is, the upper bonding metals 471b and 472b, and the second word line bonding pads, that is, the lower bonding metals 371b and 372b, and connected to the page buffer 130a through the first bit line bonding pads, that is, the upper bonding metals 471c and 472c, and the second bit line bonding pads, that is, the lower bonding metals 371c and 372c.

Figure 10:
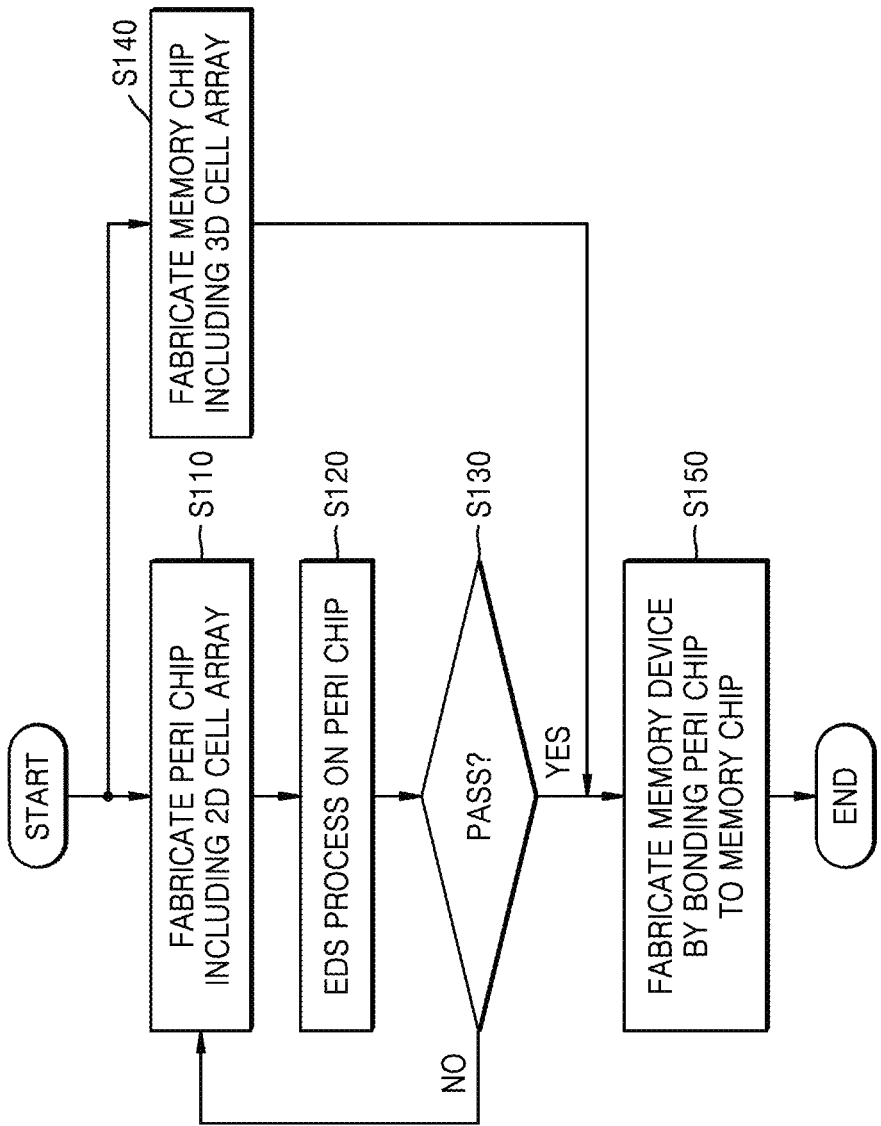
FIG. 10 is a flowchart of a method of manufacturing a memory device, according to some example embodiments.

FIG. 10 is a flowchart of a method of manufacturing a memory device, according to some example embodiments.

Referring to FIG. 10, in operation S110, a peripheral circuit chip including a 2D cell array and a peripheral circuit (which may be connected to the 2D cell array) may be fabricated. The fabricating at S110 may include fabricating the peripheral circuit chip on a second wafer, the peripheral circuit chip including the 2D cell array connected to second word lines and second bit lines, the peripheral circuit connected to the second word lines and the second bit lines, and second word line bonding pads, and second bit line bonding pads. For example, the peripheral circuit chip may correspond to the peripheral circuit chip CHIP2 of FIG. 8. In operation S120, an EDS process may be performed on the peripheral circuit chip to inspect whether or not the 2D cell array and the peripheral circuit electrically operate (e.g., are electrically connected and are configured to electrically operate independently and/or with respect to each other). In some example embodiments, referring to the peripheral circuit chip CHIP2 of FIG. 8, the EDS process inspects whether or not a test cell array TCA1 and/or TCA2 and a peripheral circuit PERI1 and/or PERU of the peripheral circuit chip CHIP2 electrically operate. In operation S130, whether the peripheral circuit chip has passed the EDS process (e.g., whether or not the 2D cell array and the peripheral circuit electrically operate) may be determined. According to the determination, when the peripheral circuit chip has passed the EDS process, operation S150 may be performed. However, when the peripheral circuit chip has failed the EDS process, operation S110 may be performed again.

A semiconductor process may sequentially include a wafer process, an oxidation process, a photolithography process, an etch process, a thin-film process, a metal interconnect process, an EDS process, and a packaging process. Here, the EDS process and the packaging process are referred to as post processes. The EDS process is a process, in which whether a semiconductor chip on which a semiconductor fabrication process is performed is good or bad is identified via a test on the semiconductor chip. The EDS process may be performed by locating a wafer on a probe card. The EDS process may include a first operation including an electrical test (ET) and a wafer burn in (WBI)

operation. In the ET, whether separate devices operate or not (e.g., are configured to operate or not) is determined via tests with respect to parameters, such as an electrical DC voltage, current characteristics, etc. In the WBI operation, a potentially defective element is discovered by applying an alternating current (AC)/DC voltage to a wafer after applying heat of a particular (or, alternatively, predetermined) temperature to the wafer. Also, the EDS process may further include a second operation corresponding to a pre-laser operation determining whether or not each chip on the wafer is normal at a particular (or, alternatively, predetermined) temperature through an electrical signal or a hot/cold test operation. Also, the EDS process may further include a third operation corresponding to a laser repair and post-laser operation in which chips, which have defects in the pre-laser operation, but repairing of which is determined to be possible, are collected and repaired using a laser beam. Also, the EDS process may further include a fourth operation corresponding to a tape laminate operation and a bake grinding operation. Also, the EDS process may further include a fifth operation corresponding to an inking operation for identifying a defective chip with the naked eye by marking the defective chip occurring in the pre-laser operation and the post-laser operation with a special ink. According to some example embodiments, operation S130 may correspond to at least one of the first through fifth operations.

In operation S140, a memory chip including a 3D cell array may be fabricated. The fabricating at S140 may include fabricating the memory chip on a first wafer, where the memory chip including the 3D cell array connected to first word lines and first bit lines, first word line bonding pads respectively connected to the first word lines, and first bit line bonding pads respectively connected to the first bit lines. For example, the memory chip may correspond to the memory chip CHIP1 of FIG. 8. Operations S110 and S140 may be substantially simultaneously performed. However, the inventive concepts are not limited thereto. Operation S140 may be performed in a particular (or, alternatively, predetermined) order prior to operation S150. In operation S150, the peripheral circuit chip may be bonded to the memory chip to fabricate a memory device. The fabricating at S150 may include bonding the peripheral circuit chip to the memory chip based on bonding the first word line bonding pads of the memory chip to the second word line bonding pads of the peripheral circuit chip and bonding the first bit line bonding pads of the memory chip to the second bit line bonding pads of the peripheral circuit chip. For example, the memory device may correspond to the memory device 100A of FIG. 9.

Figure 11:
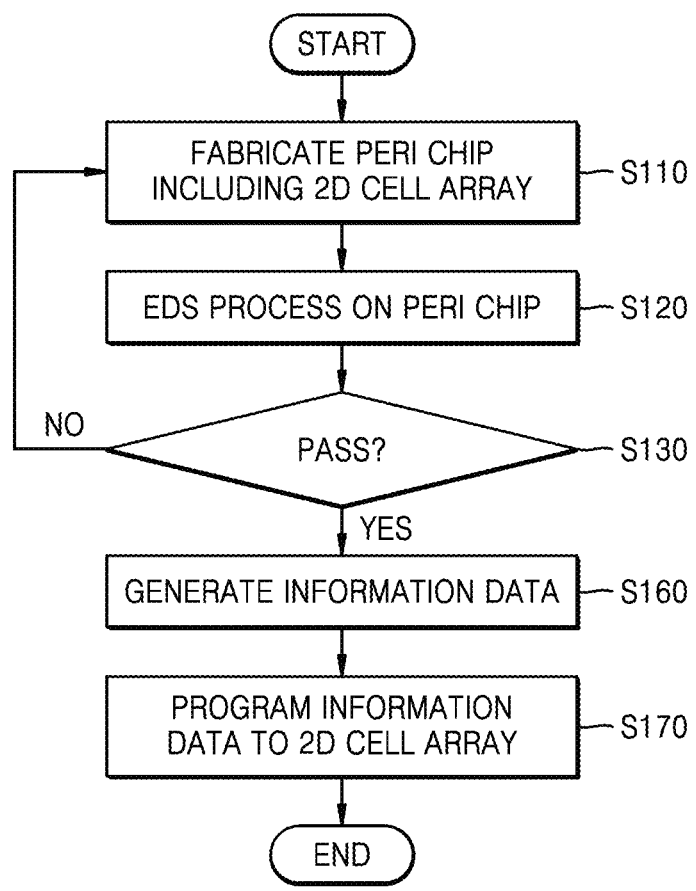
FIG. 11 is a flowchart of a method of testing a memory device, according to some example embodiments.

FIG. 11 is a flowchart of a method of testing a memory device, according to some example embodiments.

Referring to FIG. 11, the method of testing the memory device according to some example embodiments may correspond to an example included in the method of manufacturing the memory device of FIG. 10, and the descriptions given above with reference to FIG. 10 may be applied to the example embodiments described with reference to FIG. 11. In operation S110, the peripheral circuit chip including the 2D cell array and the peripheral circuit may be fabricated. In operation S120, the EDS process may be performed on the peripheral circuit chip. In operation S130, whether or not the peripheral circuit chip has passed the EDS process may be determined. According to the determination, when the peripheral circuit chip has passed the EDS process, operation S160 may be performed. However, when the peripheral circuit chip has failed the EDS process, operation S110 may be performed again.

In operation S160, based on the result of the EDS process, information data required for initializing settings of the memory device may be generated. For example, the information data may include DC trim information, option information, repair information, bad block information, bad column information, and the like. Also, for example, the information data may include a read voltage level, a pass voltage level, etc. during a data read operation. In operation S170, the information data may be programmed in the 2D cell array. Restated, after performing the EDS process at S120, information data generated at S160 as a result of the EDS process is programmed in an information data block of the 2D cell array at S170. For example, the control logic circuit 150 may program the information data in the information data block 122 of the test cell array 120. The information data block 122 of the test cell array 120 may store information data that is set through the EDS process.

Figure 12:
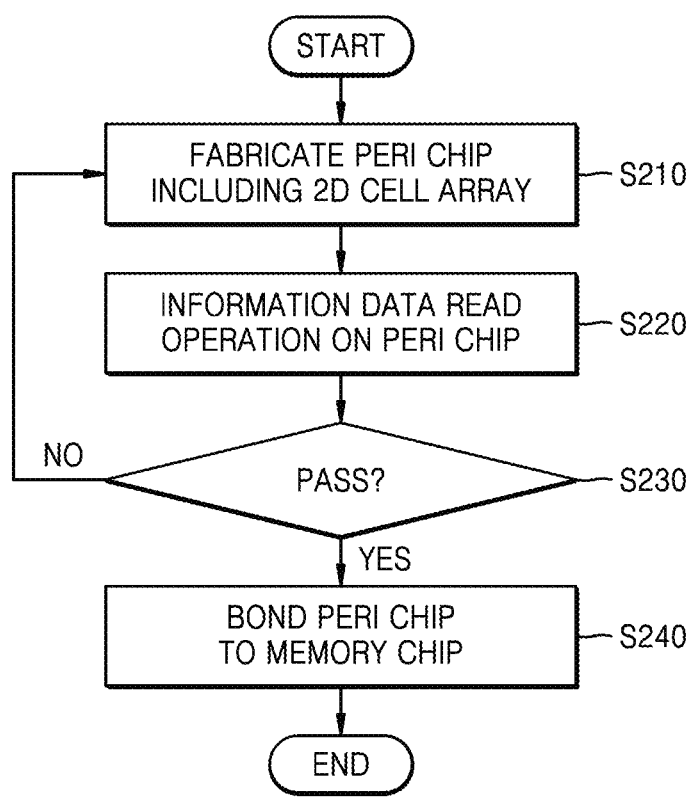
FIG. 12 is a flowchart of a method of manufacturing a memory device, according to some example embodiments.

FIG. 12 is a flowchart of a method of manufacturing a memory device, according to some example embodiments.

Referring to FIG. 12, in operation S210, a peripheral circuit chip including a 2D cell array and a peripheral circuit may be prepared. In operation S220, an IDR operation may be performed on the peripheral circuit chip. Here, the IDR operation may indicate an operation of reading information data stored in an information data block of the 2D cell array of the peripheral circuit chip. In operation S230, whether or not the IDR operation has passed may be determined. According to the determination, when the IDR operation has passed, the peripheral circuit chip may be bonded to a memory chip in operation S240. However, when the IDR operation has failed, operation S210 may be performed again.

Figure 13:
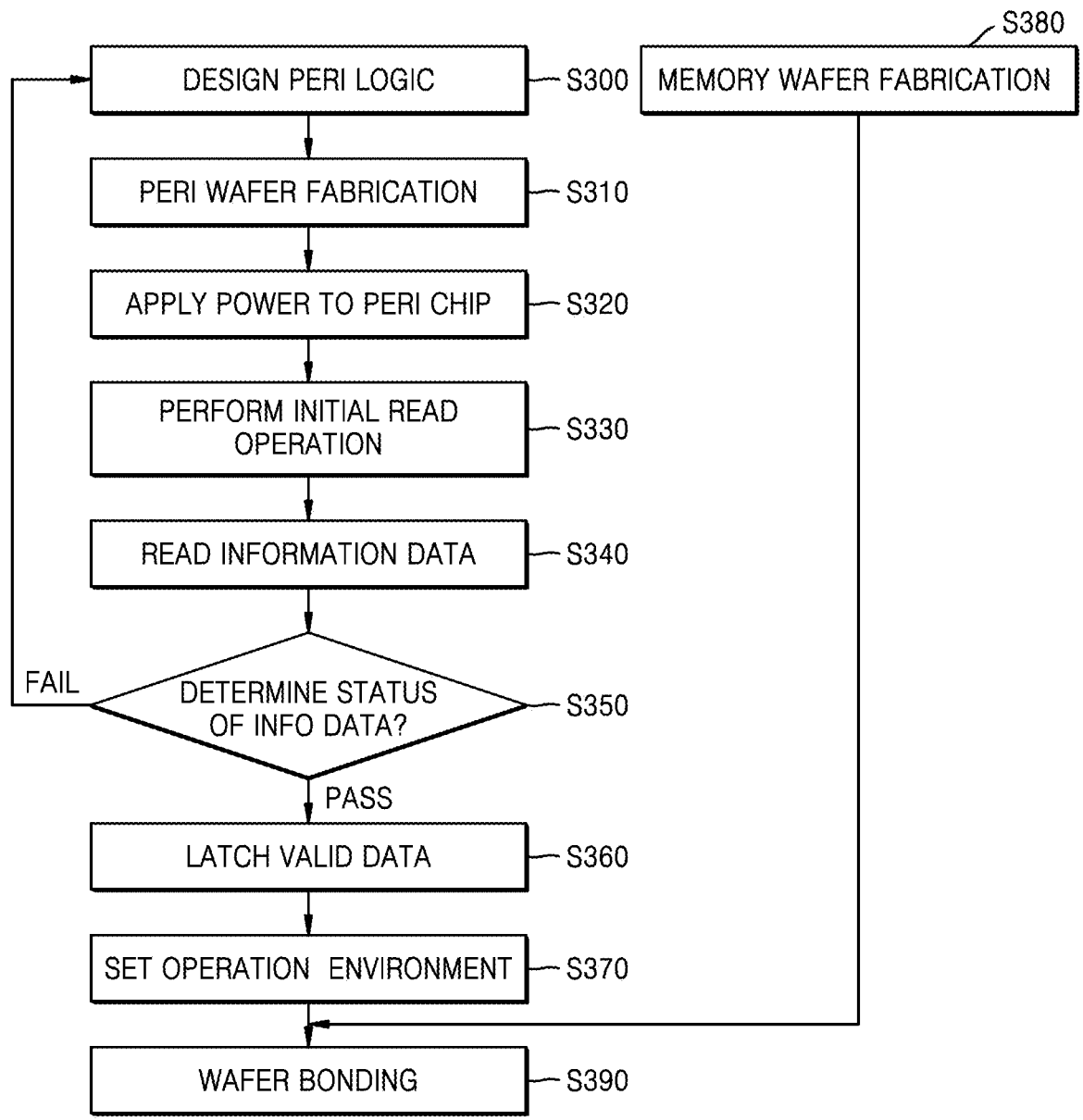
FIG. 13 is a flowchart of a method of manufacturing a memory device, according to some example embodiments.

FIG. 13 is a flowchart of a method of manufacturing a memory device, according to some example embodiments.

Referring to FIG. 13, a peripheral circuit logic may be designed in operation S300. In operation S310, a peripheral circuit wafer including a peripheral circuit chip may be fabricated and thus may be understood to be "prepared." The peripheral circuit chip includes the peripheral circuit logic and a 2D cell array may be fabricated. The peripheral circuit chip may include a two-dimensional (2D) cell array including at least one information data block storing information data and a peripheral circuit connected to the 2D cell array. The preparing of the peripheral circuit chip at S310 may include fabricating the peripheral circuit chip on a first wafer, where the peripheral circuit chip including the 2D cell array, the peripheral circuit, and a first bonding pad. The preparing of the peripheral circuit may further include performing an electrical die sorting (EDS) process for inspecting whether or not the 2D cell array and the peripheral circuit electrically operate (e.g., at S120 as described with reference to at least FIG. 11); and programming the information data generated as a result of the EDS process in the at least one information data block (e.g., at S170 as described with reference to at least FIG. 11).

In operation S320, power may be supplied to the peripheral circuit chip. In operation S330, an initial read operation may be performed on the peripheral circuit chip. For example, the initial read operation may correspond to an IDR operation. In operation S340, information data (e.g., information data included in the prepared peripheral circuit chip) may be read from the peripheral circuit chip, for example based on performing an IDR operation on the peripheral circuit chip at S330. In operation S350, a status of the information data may be determined. According to the determination, when the information data is in a valid status, operation S360 may be performed, and when the information data is not in a valid status, operation S300 may be performed again. The method of FIG. 13 may include, when the information data is non-valid information data (e.g., S350=FAIL), re-designing the peripheral circuit. Restated, the method of FIG. 13 may include, re-designing the peripheral circuit in response to a determination, at S350, that the information data is non-valid information data (e.g., S350=FAIL).

In operation S360, the valid data may be latched. In operation S370, an operating environment of the memory device may be set. In operation S380, a memory wafer including a memory chip (which may include a 3D cell array) may be fabricated. Here, operation S380 may be performed in a particular (or, alternatively, predetermined) order prior to operation S390. Operation S380 may include fabricating the memory chip on a second wafer, where the memory chip includes a 3D cell array and a second bonding pad. In operation S390, the memory device may be generated (e.g., fabricated) based on bonding the peripheral circuit chip with the memory chip through wafer bonding. It will be understand that the fabricating at S390 may be performed in response to a determination at S350 that the information data is valid information data (e.g., S350=PASS).

Figure 14:
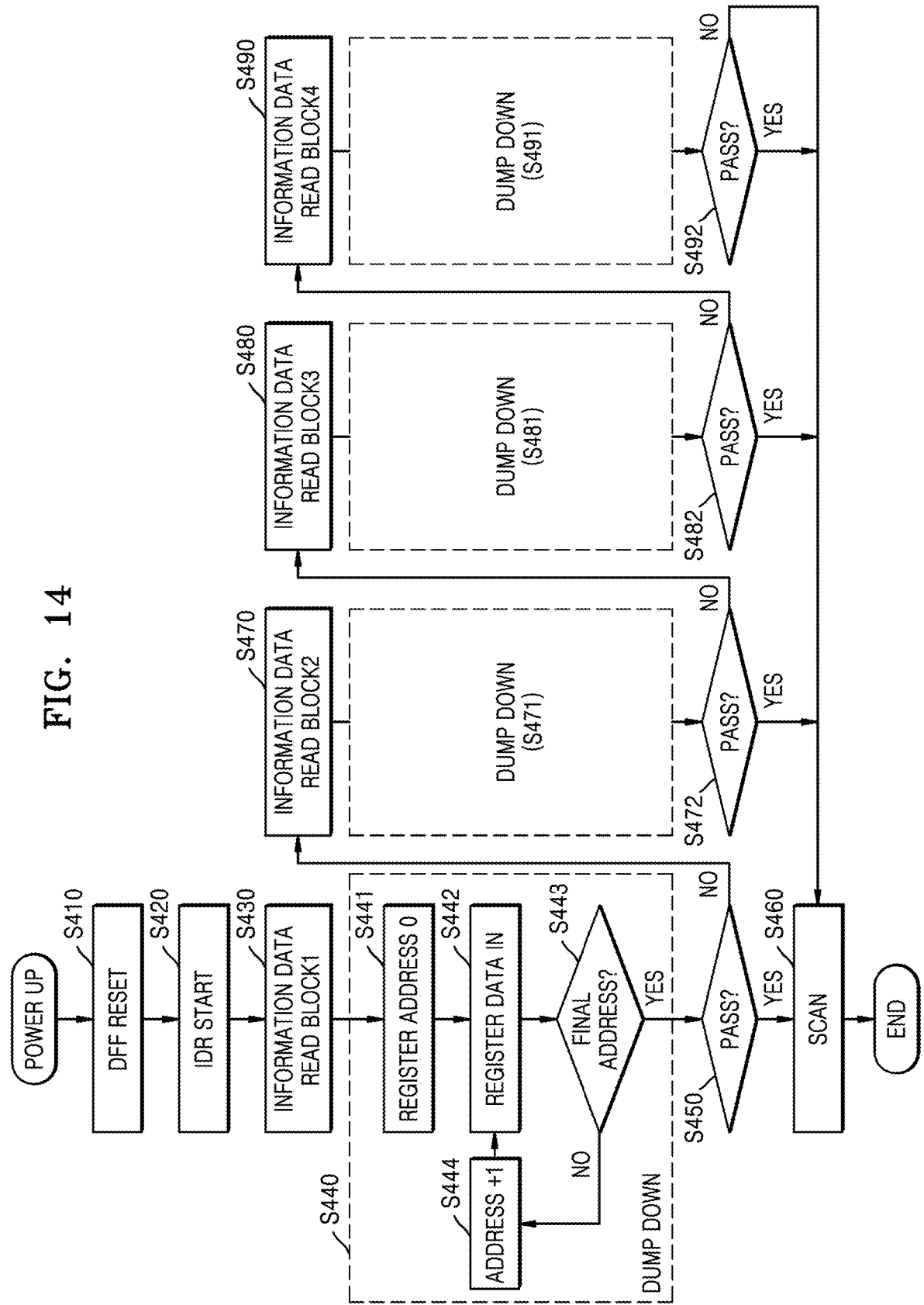
FIG. 14 is a flowchart of a method, performed by a memory device, of reading information data, according to some example embodiments.

FIG. 14 is a flowchart of a method, performed by a memory device, of reading information data, according to some example embodiments.

Referring to FIG. 14, the method of reading information data, which is performed by the memory device, may be sequentially performed on first through fourth memory blocks BLOCK1 through BLOCK4 included in a test cell array. The first through fourth memory blocks BLOCK1 through BLOCK4 may store information data generated based on a result of an EDS process. According to some example embodiments, each of the first through fourth memory blocks BLOCK1 through BLOCK4 may store the same information data. However, the inventive concepts are not limited thereto. According to some example embodiments, each of the first through fourth memory blocks BLOCK1 through BLOCK4 may store different information data.

When power is supplied to the memory device, D-flip-flops (DFFs) included in logic modules in a peripheral circuit chip may be reset in operation S410. In operation S420, an IDR sequence may be started. In operation S430, an IDR operation may be performed on the first bock BLOCK1. In operation S440, a dump-down operation may be performed. The dump-down operation may include operations S441 through S444 and may be sequentially performed on a plurality of page buffers included in a page buffer circuit.

In operation S441, an operation with respect to a $0^{th}$ register address corresponding to an address of a first page buffer may be started. In operation S442, the information data read from the first memory block BLOCK1 may be stored in a corresponding register. In operation S443, whether a corresponding page buffer is a last page buffer may be determined. According to the determination, when the corresponding page buffer is the last page buffer, operation S450 may be performed, and when the corresponding page buffer is not the last page buffer, operation S444 may be performed. In operation S444, the register address may be increased by 1.

In operation S450, whether or not an IDR operation has passed may be determined based on a pattern of the information data read from the first memory block BLOCK1. According to the determination, when the IDR operation has passed, data stored in a plurality of registers may be scanned in operation S460. However, when the IDR operation has failed, an IDR operation may be performed on the second memory block BLOCK2 in operation S470. In operation S471, a dump-down operation may be performed. In operation S472, whether or not the IDR operation has passed may be determined based on a pattern of the information data read from the second memory block BLOCK2. According to the determination, when the IDR operation has passed, operation S460 may be performed, and when the IDR operation has failed, operation S480 may be performed.

In operation S480, an IDR operation may be performed on the third memory block BLOCK3. In operation S481, a dump-down operation may be performed. In operation S482, whether or not the IDR operation has passed may be determined based on a pattern of the information data read from the third memory block BLOCK3. According to the determination, when the IDR operation has passed, operation S460 may be performed, and when the IDR operation has failed, operation S490 may be performed. In operation S490, an IDR operation may be performed on the fourth memory block BLOCK4. In operation S491, a dump-down operation may be performed. In operation S492, whether or not the IDR operation has passed may be determined based on a pattern of the information data read from the fourth memory block BLOCK4. According to the determination, both when the IDR operation has passed and when the IDR operation has failed, operation S460 may be performed. Here, operations S471, S481, and S491 may be substantially the same as operation S440.

Figure 15:
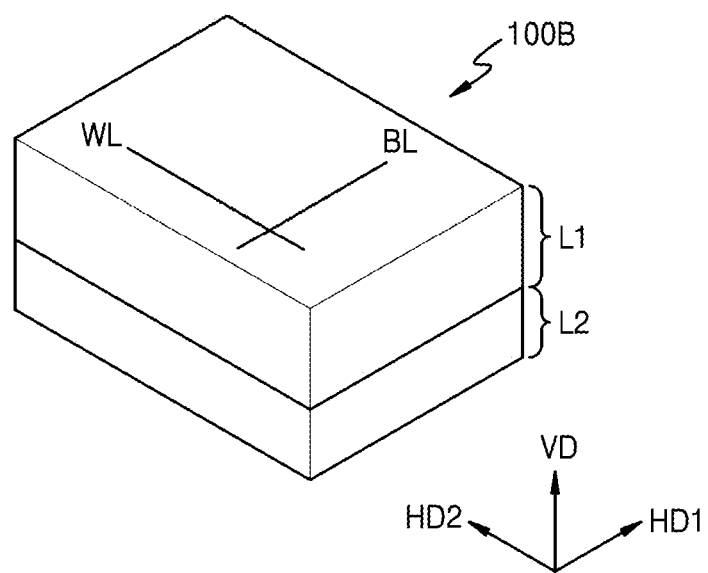
FIG. 15 schematically illustrates a structure of a memory device according to some example embodiments.

FIG. 15 schematically illustrates a structure of a memory device 100B according to some example embodiments.

Referring to FIG. 15, the memory device 100B may include a first semiconductor layer L1 and a second semiconductor layer L2, and the first semiconductor layer L1 may be stacked on the second semiconductor layer L2 in a vertical direction VD. In detail, the second semiconductor layer L2 may be arranged below the first semiconductor layer L1 in the vertical direction VD, and accordingly, the second semiconductor layer L2 may be arranged adjacent to a substrate.

According to some example embodiments, the memory cell array 110 of FIG. 2 may be formed in the first semiconductor layer L1, and the test cell array 120, the page buffer circuit 130, the data input-output circuit 140, the control logic circuit 150, the voltage generator 160, and the row decoder 170 of FIG. 2 may be formed in the second semiconductor layer L2. Accordingly, the memory device 100B may have a structure, that is, a cell over periphery (COP) structure, in which the memory cell array 110 is arranged above peripheral circuits PECT. The COP structure may effectively reduce a horizontal area and increase a degree of integration of the memory device 100B.

According to some example embodiments, the second semiconductor layer L2 may include a substrate, and transistors and metal patterns for interconnecting the transistors may be formed on the substrate, and thus, the peripheral circuits PECT may be formed in the second semiconductor layer L2. After the peripheral circuits PECT are formed in the second semiconductor layer L2, the first semiconductor layer L1 including the memory cell array 110 may be formed, and metal patterns for electrically connecting the word lines WL and the bit lines BL of the memory cell array 110 with the peripheral circuits PECT formed in the second semiconductor layer L2, may be formed. For example, the bit lines BL may extend in a first horizontal direction HD1, and the word lines WL may extend in a second horizontal direction HD2.

According to some example embodiments, after the peripheral circuits PECT including the test cell array 120 are formed in the second semiconductor layer L2, an EDS process may be performed on the second semiconductor layer L2. For example, according to a result of the EDS process, when the second semiconductor layer L2 has passed the EDS test, the memory cell array 110 may be formed in the first semiconductor layer L1. However, according to a result of the EDS process, when the second semiconductor layer L2 has failed the EDS test, the second semiconductor layer L2 may be fabricated again.

Figure 16:
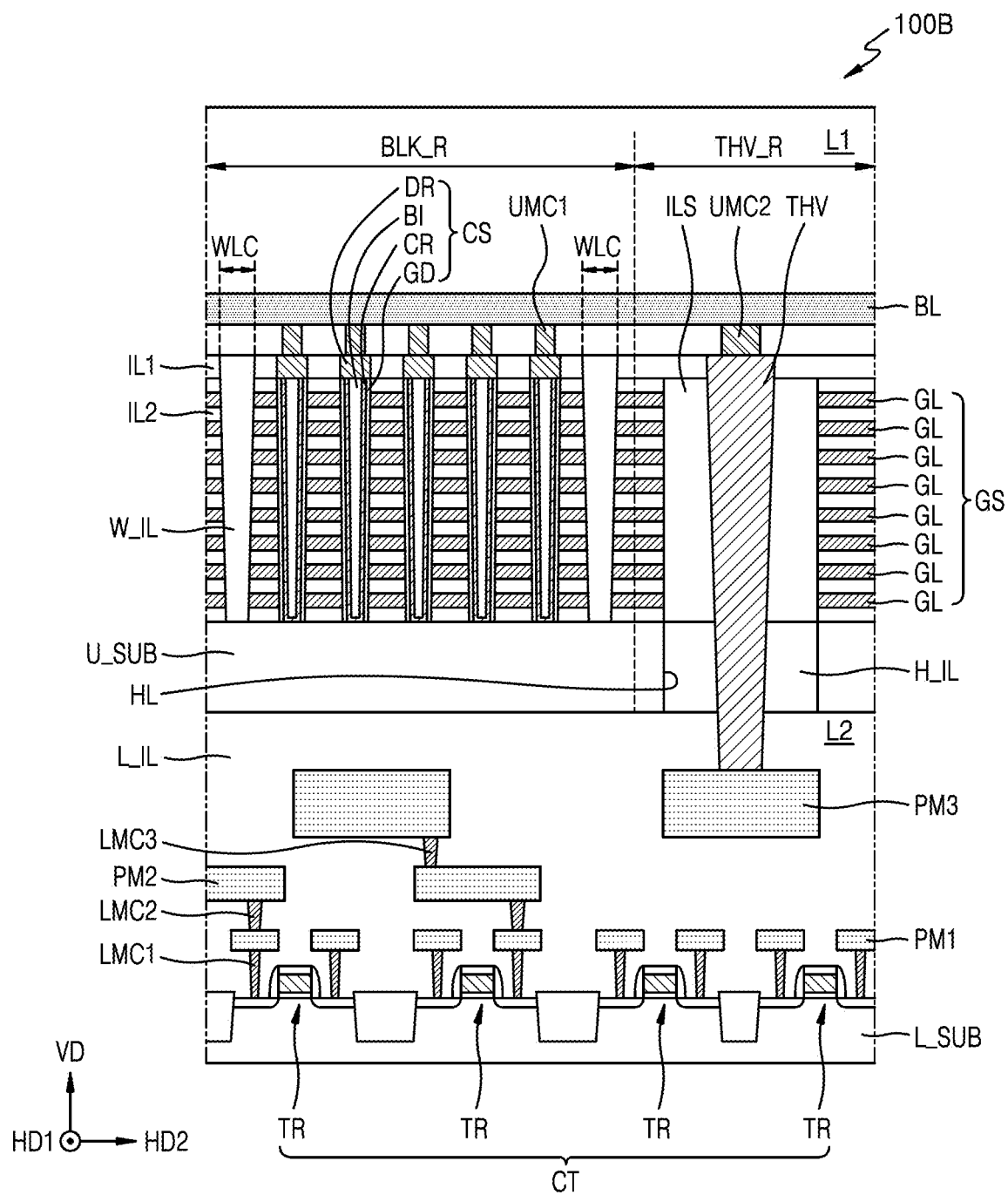
FIG. 16 is a cross-sectional view of an example of the memory device of FIG. 15, according to some example embodiments.

FIG. 16 is a cross-sectional view of an example of the memory device 100B of FIG. 15, according to some example embodiments.

Referring to FIG. 16, the second semiconductor layer L2 may include a lower substrate L_SUB and circuits CT formed on the lower substrate L_SUB. The circuits CT may include at least one transistor TR. The circuits CT may include the page buffer circuit 130 and the row decoder 170 described with reference to FIG. 2. Also, the circuits CT may further include the test cell array 120 described with reference to FIG. 2. The second semiconductor layer L2 may further include lower contacts LMC1, LMC2, and LMC3 electrically connected to the circuits CT and lower conductive lines PM1, PM2, and PM3 electrically connected to the lower contacts LMC1, LMC2, and LMC3. The circuits CT, the lower contacts LMC1, LMC2, and LMC3, and the lower conductive lines PM1, PM2, and PM3 may be covered by a lower insulating layer L_IL.

The first semiconductor layer L1 may include an upper substrate U_SUB and a plurality of channel structures CS arranged on the upper substrate U_SUB. The plurality of channel structures CS may penetrate gate conductive layers GS and extend in a vertical direction (that is, a third direction D3). The plurality of channel structures CS may be arranged to be apart from each other by a particular (or, alternatively, predetermined) distance in a first horizontal direction HD1 and a second horizontal direction HD2. Each of the plurality of channel structures CS may include a gate dielectric layer GD, a channel region CR, a buried insulating layer BI, and a drain region DR. The gate dielectric layer GD may have a structure in which the gate dielectric layer GD includes a tunneling dielectric layer, a charge storage layer, and a blocking dielectric layer that are sequentially formed from the channel region CR. The channel region CR may include doped polysilicon or un-doped polysilicon. The channel region CR may have a cylindrical shape. An inner space of the channel region CR may be filled with the buried insulating layer BI. The buried insulating layer BI may include an insulating material. In some embodiments, the buried insulating layer BI may be omitted, and in this case, the channel region CR may have a pillar structure, in which the channel region CR does not have an inner space. The drain region DR may include a doped-polysilicon layer. The drain region DR may be electrically connected to a bit line BL through a first upper contact UMC1. A plurality of drain regions DR included in the plurality of channel structures CS may be insulated from each other by a first insulating layer IL1

The first semiconductor layer L1 may further include the first upper contacts UMC1 electrically connected to the channel structures CS, a second upper contact UMC2 electrically connected to a through-electrode, that is, a through-hole-via THV, and the bit line BL. The plurality of channel structures CS and the bit line BL may be covered by an upper insulating layer U_IL. The through-electrode THV may penetrate the gate conductive layers GS and extend in a vertical direction VD. The through-electrode THV may penetrate the upper substrate U_SUB through a through-hole HL. The through-electrode THV may extend in the vertical direction VD unto a portion of the second semiconductor layer L2. The through-electrode THV may be encircled by the first insulating layer IL1 and an insulating structure ILS and may be enveloped by a buried insulating layer H_IL in the through-hole HL. The through-electrode THV may include an end connected to the bit line BL through the second upper contact UMC2 and the other end connected to the third lower conductive line PM3. Thus, the bit line BL of the first semiconductor layer L1 and the circuits CT of the second semiconductor layer L2 may be electrically connected to each other through the through-electrode THV.

The plurality of channel structures CS may be arranged in a block region BLK_R, and the through-electrode THV may be arranged in a through-electrode region THV_R. The block region BLK_R may be separated from the through-electrode region THV_R through a plurality of word line cut regions WLC extending on the upper substrate U_SUB in the first direction HD1 and the second direction HD2. The plurality of word line cut regions WLC may be filled with the insulating layer W_IL.

The gate conductive layers GS may include a plurality of gate lines GL extending in parallel with each other in the second direction HD2. For example, the gate lines GL may be included in a ground select line, word lines, and a string select line. For example, as described with reference to FIG. 5, the ground select line, the word lines, and the string select line may be sequentially formed on the upper substrate U_SUB. A second insulating layer IL2 may be formed between the plurality of gate lines GL. For example, a ground select line and a portion of the channel structure CS that is adjacent to the ground select line may form a ground select transistor (the ground select transistor GST of FIG. 4). The word lines and a portion of the channel structure CS that is adjacent to the word lines may form memory cells (the memory cells MCs of FIG. 4). The string select line and a portion of the channel structure CS that is adjacent to the string select line may form a string select transistor (the string select transistor SST of FIG. 4).

Figure 17:
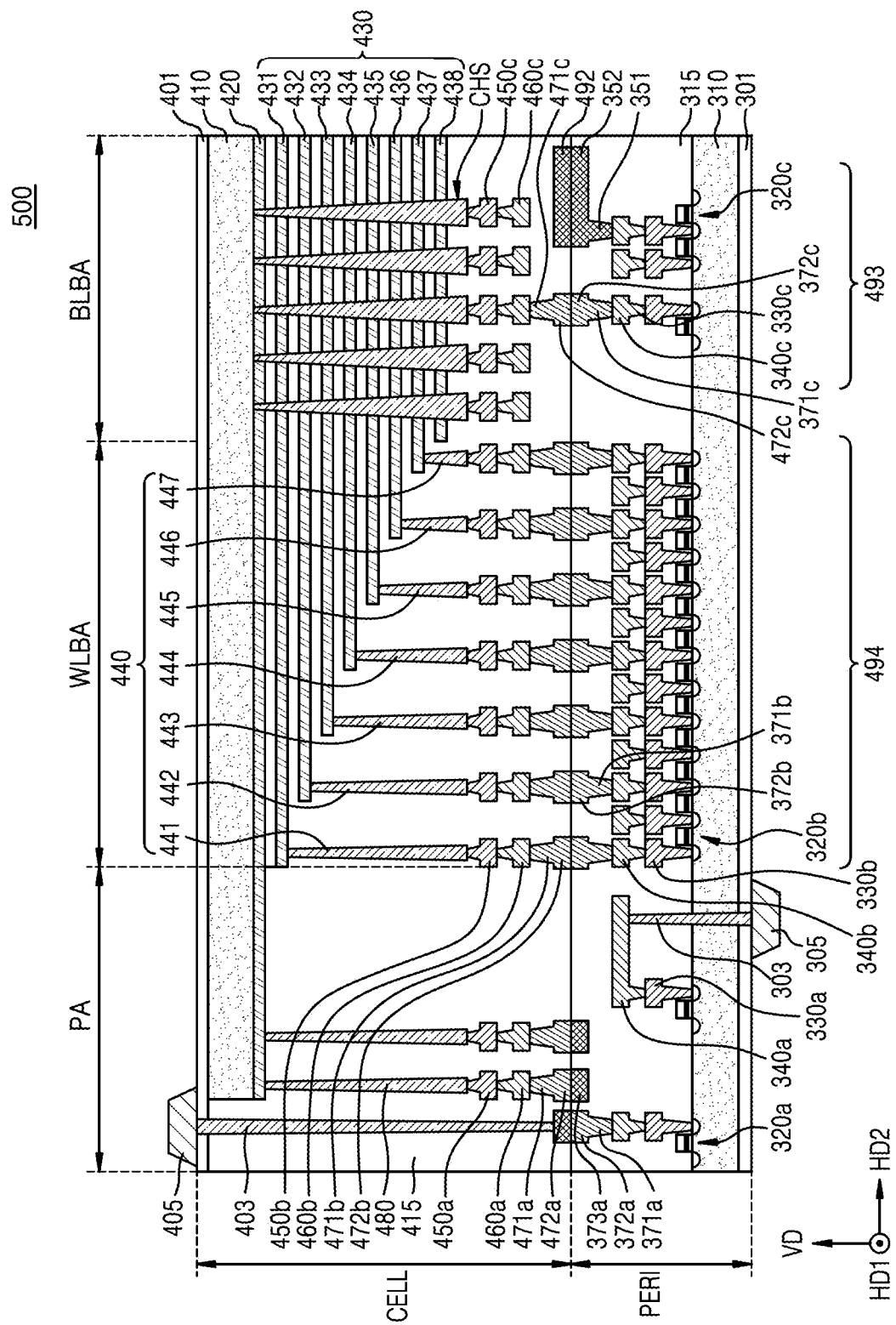
FIG. 17 is a cross-sectional view of a memory device according to some example embodiments.

FIG. 17 is a diagram illustrating a memory device 500 according to some example embodiments.

Referring to FIG. 17, a memory device 500 may have a C2C structure. Embodiments illustrated in FIGS. 1 to 14 may be implemented as the memory device 500. For example, the test cell array 120 illustrated in FIGS. 1 to 14 may be disposed on a peripheral circuit region PERI. Each of the peripheral circuit region PERI and a cell region CELL of the memory device 500 may include an external pad bonding area PA, a word line bonding area WLBA, and a bit line bonding area BLBA. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu). The example embodiments, however, may not be limited thereto. For example, the bonding metals may also be formed of aluminum (Al) or tungsten (W).

The peripheral circuit region PERI may include a first substrate 310, an interlayer insulating layer 315, a plurality of circuit elements 320a, 320b, and 320c formed on the first substrate 310, first metal layers 330a, 330b, and 330c respectively connected to the plurality of circuit elements 320a, 320b, and 320c, and second metal layers 340a, 340b, and 340c formed on the first metal layers 330a, 330b, and 330c. In some example embodiments, the first metal layers 330a, 330b, and 330c may be formed of tungsten having relatively high electrical resistivity, and the second metal layers 340a, 340b, and 340c may be formed of copper having relatively low electrical resistivity.

In some example embodiments illustrate in FIG. 17, although only the first metal layers 330a, 330b, and 330c and the second metal layers 340a, 340b, and 340c are shown and described, the example embodiments are not limited thereto, and one or more additional metal layers may be further formed on the second metal layers 340a, 340b, and 340c. At least a portion of the one or more additional metal layers formed on the second metal layers 340a, 340b, and 340c may be formed of aluminum or the like having a lower electrical resistivity than those of copper forming the second metal layers 340a, 340b, and 340c.

The interlayer insulating layer 315 may be disposed on the first substrate 310 and cover the plurality of circuit elements 320a, 320b, and 320c, the first metal layers 330a, 330b, and 330c, and the second metal layers 340a, 340b, and 340c. The interlayer insulating layer 315 may include an insulating material such as silicon oxide, silicon nitride, or the like.

Lower bonding metals 371b and 372b may be formed on the second metal layer 340b in the word line bonding area WLBA. In the word line bonding area WLBA, the lower bonding metals 371b and 372b in the peripheral circuit region PERI may be electrically bonded to upper bonding metals 471b and 472b of the cell region CELL. The lower bonding metals 371b and 372b and the upper bonding metals 471b and 472b may be formed of aluminum, copper, tungsten, or the like. Further, the upper bonding metals 471b and 472b in the cell region CELL may be referred to as first metal pads and the lower bonding metals 371b and 372b in the peripheral circuit region PERI may be referred to as second metal pads.

The cell region CELL may include at least one memory block. The cell region CELL may include a second substrate 410 and a common source line 420. On the second substrate 410, a plurality of word lines 431 to 438 (i.e., 430) may be stacked in a direction (a vertical direction), perpendicular to an upper surface of the second substrate 410. At least one string select line and at least one ground select line may be arranged on and below the plurality of word lines 430, respectively, and the plurality of word lines 430 may be disposed between the at least one string select line and the at least one ground select line.

In the bit line bonding area BLBA, a channel structure CH may extend in a direction (a vertical direction), perpendicular to the upper surface of the second substrate 410, and pass through the plurality of word lines 430, the at least one string select line, and the at least one ground select line. The channel structure CH may include a data storage layer, a channel layer, a buried insulating layer, and the like, and the channel layer may be electrically connected to a first metal layer 450c and a second metal layer 460c. For example, the first metal layer 450c may be a bit line contact, and the second metal layer 460c may be a bit line. In some example embodiments, the bit line 460c may extend in a first direction (a first horizontal direction), parallel to the upper surface of the second substrate 410.

In some example embodiments illustrated in FIG. 17, an area in which the channel structure CH, the bit line 460c, and the like are disposed may be defined as the bit line bonding area BLBA. In the bit line bonding area BLBA, the bit line 460c may be electrically connected to the circuit elements 320c providing a page buffer 493 in the peripheral circuit region PERI. The bit line 460c may be connected to upper bonding metals 471c and 472c in the cell region CELL, and the upper bonding metals 471c and 472c may be connected to lower bonding metals 371c and 372c connected to the circuit elements 320c of the page buffer 493.

In the word line bonding area WLBA, the plurality of word lines 430 may extend in a second direction (a second horizontal direction), parallel to the upper surface of the second substrate 410 and perpendicular to the first direction, and may be connected to a plurality of cell contact plugs 441 to 447 (i.e., 440). The plurality of word lines 430 and the plurality of cell contact plugs 440 may be connected to each other in pads provided by at least a portion of the plurality of word lines 430 extending in different lengths in the second direction. A first metal layer 450b and a second metal layer 460b may be connected to an upper portion of the plurality of cell contact plugs 440 connected to the plurality of word lines 430, sequentially. The plurality of cell contact plugs 440 may be connected to the peripheral circuit region PERI by the upper bonding metals 471b and 472b of the cell region CELL and the lower bonding metals 371b and 372b of the peripheral circuit region PERI in the word line bonding area WLBA.

The plurality of cell contact plugs 440 may be electrically connected to the circuit elements 320b forming a row decoder 494 in the peripheral circuit region PERI. In some example embodiments, operating voltages of the circuit elements 320b of the row decoder 494 may be different than operating voltages of the circuit elements 320c forming the page buffer 493. For example, operating voltages of the circuit elements 320c forming the page buffer 493 may be greater than operating voltages of the circuit elements 320b forming the row decoder 494.

A common source line contact plug 480 may be disposed in the external pad bonding area PA. The common source line contact plug 480 may be formed of a conductive material such as a metal, a metal compound, polysilicon, or the like, and may be electrically connected to the common source line 420. A first metal layer 450a and a second metal layer 460a may be stacked on an upper portion of the common source line contact plug 480, sequentially. For example, an area in which the common source line contact plug 480, the first metal layer 450a, and the second metal layer 460a are disposed may be defined as the external pad bonding area PA.

Input-output pads 305 and 405 may be disposed in the external pad bonding area PA. Referring to FIG. 17, a lower insulating film 301 covering a lower surface of the first substrate 310 may be formed below the first substrate 310, and a first input-output pad 305 may be formed on the lower insulating film 301. The first input-output pad 305 may be connected to at least one of the plurality of circuit elements 320a, 320b, and 320c disposed in the peripheral circuit region PERI through a first input-output contact plug 303, and may be separated from the first substrate 310 by the lower insulating film 301. In addition, a side insulating film may be disposed between the first input-output contact plug 303 and the first substrate 310 to electrically separate the first input-output contact plug 303 and the first substrate 310.

Referring to FIG. 17, an upper insulating film 401 covering the upper surface of the second substrate 410 may be formed on the second substrate 410, and a second input-output pad 405 may be disposed on the upper insulating film 401. The second input-output pad 405 may be connected to at least one of the plurality of circuit elements 320a, 320b, and 320c disposed in the peripheral circuit region PERI through a second input-output contact plug 403. In some example embodiments, the second input-output pad 405 is electrically connected to a circuit element 320a.

According to some example embodiments, the second substrate 410 and the common source line 420 may not be disposed in an area in which the second input-output contact plug 403 is disposed. Also, the second input-output pad 405 may not overlap the word lines 430 in the third direction (the vertical direction). Referring to FIG. 17, the second input-output contact plug 403 may be separated from the second substrate 410 in a direction, parallel to the upper surface of the second substrate 410, and may pass through the interlayer insulating layer 415 of the cell region CELL to be connected to the second input-output pad 405.

According to some example embodiments, the first input-output pad 305 and the second input-output pad 405 may be selectively formed. For example, the memory device 500 may include only the first input-output pad 305 disposed on the first substrate 310 or the second input-output pad 405 disposed on the second substrate 410. Alternatively, the memory device 500 may include both the first input-output pad 305 and the second input-output pad 405.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 500 may include a lower metal pattern 373a, corresponding to an upper metal pattern 472a and bonding metal layer 471a formed in an uppermost metal layer of the cell region CELL, and having the same cross-sectional shape as the upper metal pattern 472a of the cell region CELL so as to be connected to each other, in an uppermost metal layer of the peripheral circuit region PERI. In the peripheral circuit region PERI, the lower metal pattern 373a formed in the uppermost metal layer of the peripheral circuit region PERI may not be connected to a contact. Similarly, in the external pad bonding area PA, an upper metal pattern 472a, corresponding to the lower metal pattern 373a formed in an uppermost metal layer of the peripheral circuit region PERI, and having the same shape as a lower metal pattern 373a of the peripheral circuit region PERI, may be formed in an uppermost metal layer of the cell region CELL.

The lower bonding metals 371a and 372a may be formed on the second metal layer 340b in the external pad bonding area PA and which may be connected to the second input-output contact plug 403 of the cell region CELL (e.g., directly or via an upper metal pattern 492 of the cell region CELL).

The lower bonding metals 371b and 372b may be formed on the second metal layer 340b in the word line bonding area WLBA. In the word line bonding area WLBA, the lower bonding metals 371b and 372b of the peripheral circuit region PERI may be electrically connected to the upper bonding metals 471b and 472b of the cell region CELL by a Cu-to-Cu bonding.

Further, in the bit line bonding area BLBA, an upper metal pattern 492, corresponding to a lower metal pattern 352 and lower bonding metal 351 formed in the uppermost metal layer of the peripheral circuit region PERI, and having the same cross-sectional shape as the lower metal pattern 352 of the peripheral circuit region PERI, may be formed in an uppermost metal layer of the cell region CELL. A contact may not be formed on the upper metal pattern 492 formed in the uppermost metal layer of the cell region CELL.

In some example embodiments, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Figure 18:
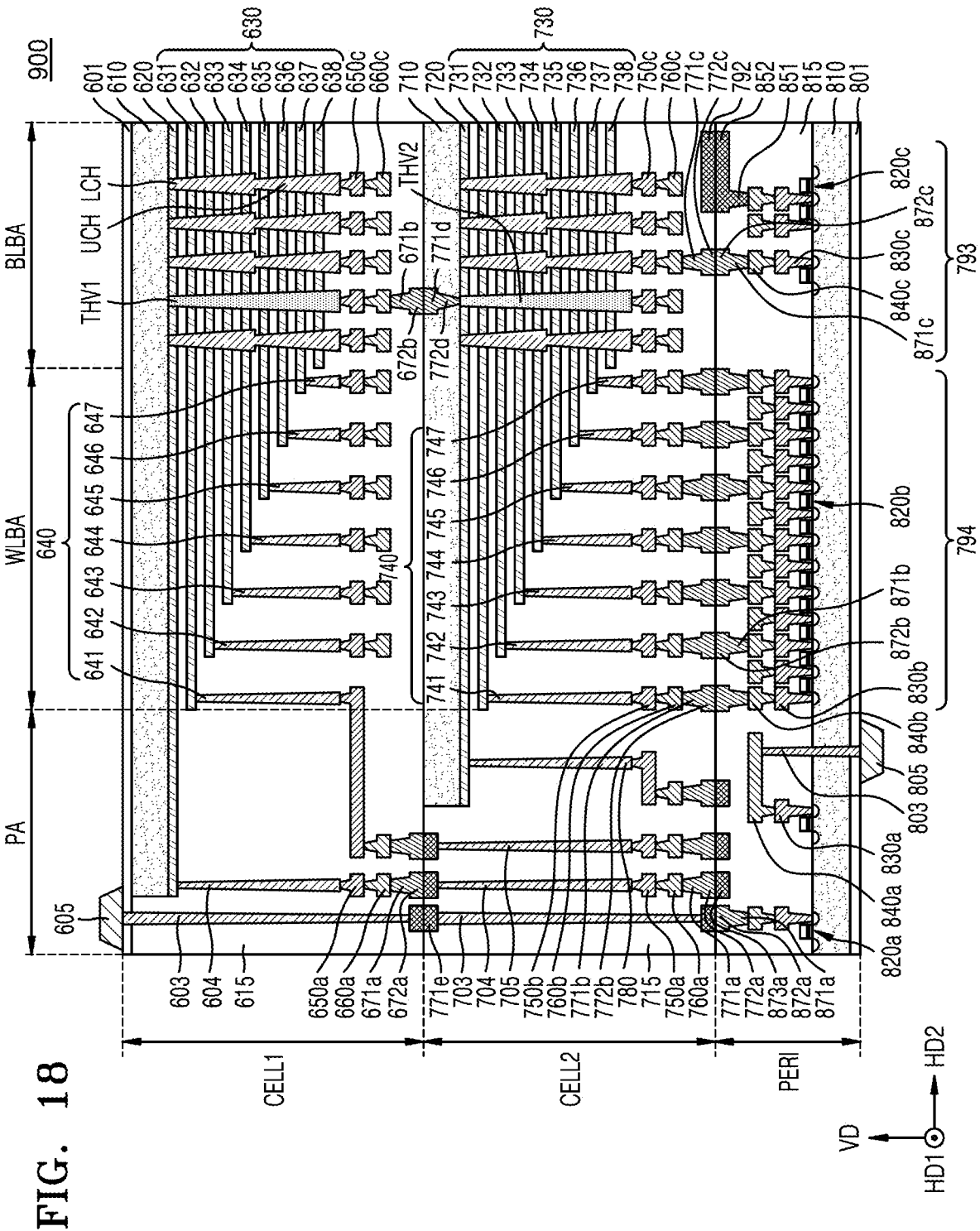
FIG. 18 is a cross-sectional view of a memory device according to some example embodiments.

FIG. 18 is a cross-sectional view of a memory device 900 according to some example embodiments.

Referring to FIG. 18, unlike the memory device 500 of FIG. 17, the memory device 900 may include two or more upper chips including a cell region. In detail, the memory device 900 may have a structure in which a first upper chip including a first cell region CELL1, a second upper chip including a second cell region CELL2, and a lower chip including a peripheral circuit region PERI are bonded to be connected to one another. However, the number of upper chips is not limited thereto. Aspects of the first cell region CELL1, the second cell region CELL2, and the peripheral circuit region PERI that are described with reference to FIG. 17 will not be described. Hereinafter, the cell region CELL may refer to at least one of the first cell region CELL1 and the second cell region CELL2.

The cell region CELL may include a lower channel LCH and an upper channel UCH connected to each other in a bit line bonding area BLBA. The lower channel LCH and the upper channel UCH may be connected to each other and may form a channel structure CHS. That is, unlike the channel structure CHS of FIG. 17, the channel structure CHS of FIG. 18 may be formed by a process on the lower channel LCH and a process on the upper channel UCH. In the first cell region CELL1, the lower channel LCH may extend in a vertical direction VD with respect to an upper surface of a third substrate 610 and may penetrate a common source line 620 and lower word lines 631 through 634. The lower channel LCH may include a data storage layer, a channel layer, a buried insulating layer, and the like, and may be connected to the upper channel UCH. The upper channel UCH may penetrate upper word lines 635 through 638. The upper channel UCH may include a data storage layer, a channel layer, a buried insulating layer, and the like, and the channel layer of the upper channel UCH may be electrically connected to a first metal layer 650c and a second metal layer 660c. As a channel length is increased, it may become difficult to form a channel having a constant width, due to a process factor. The memory device 900 according to some example embodiments may have a channel having improved width uniformity through the lower channel LCH and the upper channel UCH formed by sequential processes.

As described above with reference to FIG. 17, a string select line and a ground select line may be arranged above and below the word lines 630 and 730, respectively. According to some example embodiments, a word line adjacent to the string select line or a word line adjacent to the ground select line may be a dummy word line. In the memory device 900 according to some example embodiments, the word line arranged around a boundary of the lower channel LCH and the upper channel UCH may be a dummy word line. For example, the word lines 634 and 635 forming a boundary of the lower channel LCH and the upper channel UCH may be dummy word lines.

In the bit line bonding area BLBA, the first cell region CELL1 may include a first through-electrode THV1, and the second cell region CELL2 may include a second through-electrode THV2. The first through-electrode THV1 may penetrate the common source line 620 and the plurality of word lines 630. The first through-electrode THV1 may further penetrate the third substrate 610. The first through-electrode THV1 may include a conductive material. Alternatively, the first through-electrode THV1 may include a conductive material surrounded by an insulating material. The second through-electrode THV2 may be the same as the first through-electrode THV1. The first through-electrode THV1 and the second through-electrode THV2 may be electrically connected to each other through a first through-upper metal pattern 672*b* and a second through-lower metal pattern 771*d*. The first through-upper metal pattern 672*b* may be formed on an upper end of the first upper chip including the first cell region CELL1, and the second through-lower metal pattern 771*d* may be formed on a lower end of the second upper chip including the second cell region CELL2. The first through-electrode THV1 may be electrically connected to the first metal layer 650*c* and the second metal layer 660*c*. A first through-via 671*b* may be formed between the second metal layer 660*c* and the first through-upper metal pattern 672*b*, and a second through-via 772*d* may be formed between the second through electrode THV2 and the second through-lower metal pattern 771*d*. The first through-upper metal pattern 672*b* and the second through-lower metal pattern 771*d* may be bonded to be connected to each other.

According to some example embodiments, a first upper metal pattern 672*a* may be formed on an upper end of the first cell region CELL1, and a first lower metal pattern 771*e* may be formed on a lower end of the second cell region CELL2. The first upper metal pattern 672*a* of the first cell region CELL1 and the first lower metal pattern 771*e* of the second cell region CELL2 may be bonded to be connected to each other in an external pad bonding area PA. A second upper metal pattern 772*a* may be formed on an upper end of the second cell region CELL2, and a second lower metal pattern 873*a* may be formed on a lower end of the peripheral circuit region PERI. The second upper metal pattern 772*a* of the second cell region CELL2 and the second lower metal pattern 873*a* of the peripheral circuit region PERI may be bonded to be connected to each other in the external pad bonding area PA.

The peripheral circuit area PERI may include a first substrate 810, an interlayer insulating layer 815, circuit elements 820*a*, 820*b*, and 820*c* formed on the first substrate 810, first metal layers 830*a*, 830*b*, and 830*c* respectively connected to the circuit elements 820*a*, 820*b*, and 820*c*, and second metal layers 840*a*, 840*b*, 840*c* formed on the first metal layers 830*a*, 830*b*, 830*c*. In some embodiments, the first metal layers 830*a*, 830*b*, and 830*c* may be formed of tungsten having a relatively high resistance, and the second metal layers 840*a*, 840*b* and 840*c* may be formed of copper having a relatively low resistance.

In this example, only the first metal layers 830*a*, 830*b*, and 830*c* and the second metal layers 840*a*, 840*b*, and 840*c* are shown and described, but the inventive concept is not limited thereto, and at least one metal layer may be further formed on the second metal layers 840*a*, 840*b*, and 840*c*. At least some of the one or more metal layers formed on the second metal layers 840*a*, 840*b*, and 840*c* may be formed of aluminum or the like having a lower resistance than copper forming the second metal layers 840*a*, 840*b*, and 840*c*.

The interlayer insulating layer 815 may be disposed on the first substrate 810 to cover the plurality of circuit elements 820*a*, 820*b*, and 820*c*, the first metal layers 830*a*, 830*b*, and 830*c*, and the second metal layers 840*a*, 840*b*, and 840*c*, and may include an insulating material such as silicon oxide, silicon nitride, or the like.

Lower bonding metals 871*b* and 872*b* may be formed on the second metal layer 840*b* in the word line bonding area WLBA. In the word line bonding area WLBA, the lower bonding metals 871*b* and 872*b* of the peripheral circuit area PERI may be electrically connected to each other by a bonding method with upper bonding metals 771*b* and 772*b* of the second cell area CELL2, and the lower bonding metals 871*b* and 872*b* and the upper bonding metals 771*b* and 772*b* may be formed of aluminum, copper, or tungsten. The upper bonding metals 771*b* and 772*b* of the second cell area CELL2 may be referred to as first metal pads, and the lower bonding metals 871*b* and 872*b* of the peripheral circuit area PERI may be referred to as second metal pads.

The second cell area CELL2 may include a second substrate 710 and a common source line 720. On the second substrate 710, word lines 731 to 738 (i.e., 730) may be stacked along a vertical direction VD perpendicular to the upper surface of the second substrate 710. String selection lines and ground selection lines may be disposed on each of the upper and lower portions of the word lines 730, and the word lines 730 may be disposed between the string selection lines and the ground selection line.

For example, the first metal layer 750*c* may be a bit line contact, and the second metal layer 760*c* may be a bit line. In an embodiment, the bit line 760*c* may extend in a first horizontal direction HD1 parallel to the upper surface of the second substrate 710. The bit line 760*c* may be electrically connected to the circuit elements 820*c* providing a page buffer 793 in the peripheral circuit area PERI in the bit line bonding area BLBA. As an example, the bit line 760*c* is connected to the upper bonding metals 771*c* and 772*c*, and the upper bonding metals 771*c* and 772*c* may be connected to lower bonding metals 871*c* and 872*c* connected to the circuit elements 820*c* of the page buffer 793.

In the word line bonding area WLBA, the word lines 730 may extend along a second horizontal direction HD2 parallel to the upper surface of the second substrate 710, and may be connected to a plurality of cell contact plugs 741 to 747 (i.e., 740). The word lines 730 and the cell contact plugs 740 may be connected to each other by pads provided by extending at least some of the word lines 730 to different lengths along the second horizontal direction HD2. A first metal layer 750*b* and a second metal layer 760*b* may be sequentially connected to the upper portions of the cell contact plugs 740 connected to the word lines 730. The cell contact plugs 740 may be connected to the peripheral circuit area PERI through the upper bonding metals 771*b* and 772*b* of the second cell area CELL2 and the lower bonding metals 871*b* and 872*b* of the peripheral circuit area PERI in the word line bonding area WLBA.

The cell contact plugs 740 may be electrically connected to the circuit elements 820*b* providing a row decoder 794 in the peripheral circuit area PERI. In an embodiment, operating voltages of the circuit elements 820*b* providing the row decoder 794 may be different from the operating voltages of the circuit elements 820*c* providing the page buffer 793. For example, the operating voltages of the circuit elements 820*c* providing the page buffer 793 may be greater than the operating voltages of the circuit elements 820b providing the row decoder 794.

A common source line contact plug 780 may be disposed in the outer pad bonding area PA. The common source line contact plug 780 is formed of a conductive material such as a metal, a metal compound, or polysilicon, and may be electrically connected to the common source line 720. A first metal layer 750a and a second metal layer 760a may be sequentially stacked on the common source line contact plug 780. For example, an area where the common source line contact plug 780, the first metal layer 750a, and the second metal layer 760a are disposed may be defined as an outer pad bonding area PA. The second metal layer 760a is connected to upper bonding metal 771a.

The first cell area CELL1 may include a first substrate 610 and a common source line 620. On the third substrate 610, word lines 631 to 638 (i.e., 630) may be stacked along the vertical direction VD perpendicular to the upper surface of the third substrate 610. String selection lines and ground selection lines may be disposed on each of the upper and lower portions of the word lines 630, and the word lines 630 may be disposed between the string selection lines and the ground selection line.

For example, a first metal layer 650c may be a bit line contact, and a second metal layer 660c may be a bit line. In an embodiment, the bit line 660c may extend in the first horizontal direction HD1 parallel to the upper surface of the third substrate 610. The bit line 660c may be electrically connected to the circuit elements 620c providing the page buffer 793 in the peripheral circuit area PERI in the bit line bonding area BLBA.

In the word line bonding area WLBA, the word lines 630 may extend along the second horizontal direction HD2 parallel to the upper surface of the third substrate 610, and may be connected to a plurality of cell contact plugs 641 to 647 (i.e., 640). The word lines 630 and the cell contact plugs 640 may be connected to each other by pads provided by extending at least some of the word lines 630 to different lengths along the second horizontal direction HD2. For example, the cell contact plug 641 is connected to a contact plug 705 of the second cell area CELL2.

A common source line contact plug 604 may be disposed in the outer pad bonding area PA. The common source line contact plug 604 is formed of a conductive material such as a metal, a metal compound, or polysilicon, and may be electrically connected to the common source line 620. A first metal layer 650a and a second metal layer 760a may be sequentially stacked on the common source line contact plug 604. For example, an area where the common source line contact plug 604, the first metal layer 650a, and a second metal layer 660a are disposed may be defined as an outer pad bonding area PA. The second metal layer 660a is connected to the first metal layer 750a through upper bonding metals 671a and 672a and a contact plug 704.

Further, I/O pads 805 and 605 may be disposed in the outer pad bonding area PA. Referring to FIG. 18, a lower insulating layer 801 covering a lower surface of the first substrate 810 may be formed under the first substrate 810, and a first I/O pad 805 may be formed on the lower insulating layer 801. The first I/O pad 805 may be connected to at least one of the plurality of circuit elements 820a, 820b, and 820c disposed in the peripheral circuit area through a first I/O contact plug 803, and may be separated from the first substrate 810 by the lower insulating layer 801. In addition, a side insulating layer may be disposed between the first I/O contact plug 803 and the first substrate 810 to electrically separate the first I/O contact plug 803 from the first substrate 810.

Referring to FIG. 18, an upper insulating layer 601 covering an upper surface of the third substrate 610 may be formed on the third substrate 610, and a second I/O pad 605 may be disposed on the upper insulating layer 601. The second I/O pad 605 may be connected to at least one of the plurality of circuit elements 820a, 820b, and 820c disposed in the peripheral circuit area PERI through a third I/O contact plug 603 and a second I/O contact plug 703. For example, the second I/O pad 605 may be connected to the circuit elements 820a through the second I/O contact plug 703, the upper metal patterns of the second memory cell area CELL2, and lower metal patterns 872a and 871a of the peripheral circuit area PERI.

According to embodiments, the second substrate 710 and the common source line 720 may not be disposed in an area where the second I/O contact plug 703 is disposed. Also, the second I/O pad 605 may not overlap with the word lines 630 and 730 in the vertical direction VD. Referring to FIG. 18, the second I/O contact plug 703 may be separated from the second substrate 710 in the second horizontal direction HD2 parallel to the upper surface of the second substrate 710, and may pass through an interlayer insulating layer 715 of the second cell area CELL2. The third I/O contact plug 603 may be separated from the third substrate 610 in the second horizontal direction HD2 parallel to the upper surface of the third substrate 610, and may pass through an interlayer insulating layer 615 of the first cell area CELL1 to be connected to the second I/O pad 605.

In some embodiments, the first I/O pad 805 and the second I/O pad 605 may be selectively formed. For example, the memory device 900 may include only the first I/O pad 805 disposed on the first substrate 810, or may include only the second I/O pad 605 disposed on the third substrate 610. Alternatively, the memory device 900 may include both the first I/O pad 805 and the second I/O pad 605.

In each of the outer pad bonding area PA and the bit line bonding area BLBA respectively included in the first and second cell areas and the peripheral circuit area, the metal pattern of the uppermost metal layer may exist as a dummy pattern, or the uppermost metal layer may be empty.

Lower bonding metals 871b and 872b may be formed on the second metal layer 840b in the word line bonding area WLBA. In the word line bonding area WLBA, the lower bonding metals 871b and 872b of the peripheral circuit area may be electrically connected to each other through a bonding method with the upper bonding metals 771b and 772b of the second cell area CELL2.

Also, in the bit line bonding area BLBA, in correspondence to the lower metal pattern 852 formed on the uppermost metal layer of the peripheral circuit area, an upper metal pattern 792 having the same shape as the lower metal pattern 852 of the peripheral circuit area PERI may be formed on the uppermost metal layer of the second cell area CELL2. A contact may not be formed on the upper metal pattern 792 formed on the uppermost metal layer of the second cell area CELL2.

Figure 19:
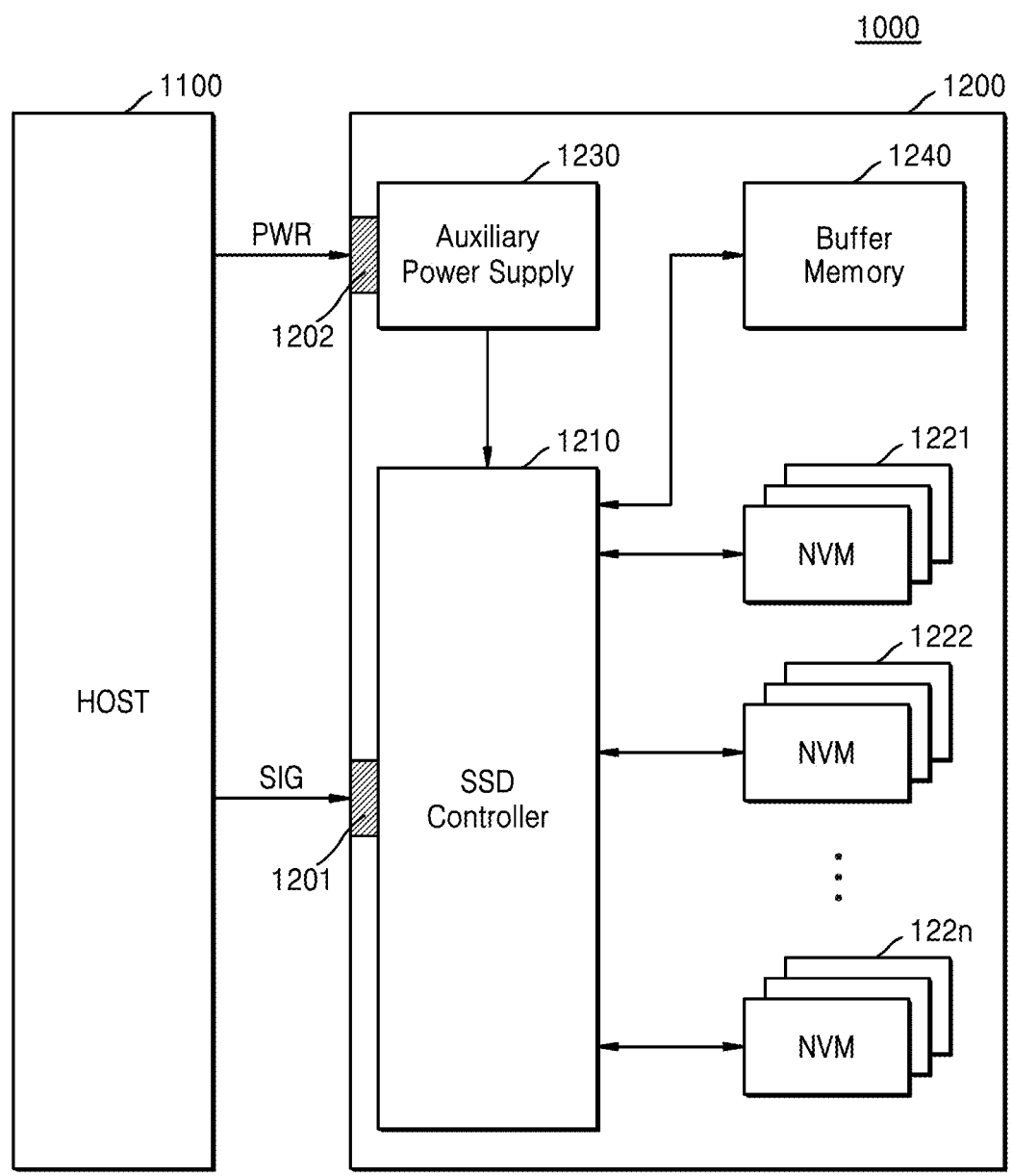
FIG. 19 is a block diagram of a solid state drive (SSD) system in which a memory device is implemented, according to some example embodiments.

FIG. 19 is a block diagram of an SSD system 1000 in which a memory device according to some example embodiments is implemented.

Referring to FIG. 19, the SSD system 1000 may include a host 1100 and an SSD 1200. The SSD 1200 may exchange a signal SIG with the host 1100 through a signal connector 1201 and receive power PWR through a power connector 1202. The SSD 1200 may include an SSD controller 1210, an auxiliary power supply 1230, buffer memory 1240, and non-volatile memory devices (NVM) 1221 to 122*n* (n being any positive integer). The memory devices NVM 1221 to 122*n* may be vertically stacked NAND flash memory devices. Here, the SSD 1200 may be realized by using any of the example embodiments described above with reference to FIGS. 1 through 18.

In some example embodiments, some or all of the devices and/or elements thereof as described herein with reference to any of the drawings (including without limitation the elements of the memory system 10, the memory device 100, the SSD system 1000, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), an application processor (AP), a microcomputer, a field programmable gate array (FPGA), and programmable logic unit, a microprocessor, application-specific integrated circuit (ASIC), a neural network processing unit (NPU), an Electronic Control Unit (ECU), and the like. In some example embodiments, the processing circuitry may include a non-transitory computer readable storage device, for example a solid state drive (SSD), storing a program of instructions, and a processor (e.g., CPU) configured to execute the program of instructions to implement the functionality of any of the elements of the devices and/or elements thereof as described herein (including without limitation the elements of the memory system 10, the memory device 100, the SSD system 1000, or the like). It will be further understood that the processing circuitry may be configured to perform any of the methods as described herein, for example based on including include a non-transitory computer readable storage device, for example a solid state drive (SSD), storing a program of instructions, and a processor (e.g., CPU) configured to execute the program of instructions to implement any or all of the operations of any of the methods according to any of the example embodiments (e.g., any or all of the operations of any or all of the methods shown in FIGS. 10-14).

While the inventive concepts have been particularly shown and described with reference to some example embodiments thereof, it will be understood that various changes in form and details may be made therein without departing from the spirit and scope of the following claims.

What is claimed is:

1. A memory device, comprising:
   a memory chip including
     a memory cell array connected to first word lines and first bit lines,
     first word line bonding pads respectively connected to the first word lines, and
     first bit line bonding pads respectively connected to the first bit lines; and
   a peripheral circuit chip, wherein the peripheral circuit chip includes
     a test cell array connected to second word lines and second bit lines,
     second word line bonding pads respectively connected to the first word line bonding pads,
     second bit line bonding pads respectively connected to the first bit line bonding pads, and
     a peripheral circuit connected to
       the second word line bonding pads and the second word lines, or
       the second bit line bonding pads and the second bit lines,
   wherein the memory cell array is disposed above the test cell array in a vertical direction.

2. The memory device of claim 1, wherein the peripheral circuit chip is vertically connected to the memory chip via the first and second word line bonding pads and the first and second bit line bonding pads.

3. The memory device of claim 1, wherein
   the memory cell array includes a three-dimensional (3D) cell array including a plurality of memory blocks, and
   each memory block of the plurality of memory blocks includes a plurality of vertical NAND strings.

4. The memory device of claim 1, wherein
   the test cell array includes a two-dimensional (2D) cell array including at least one test block, and
   the at least one test block includes a plurality of planar NAND strings.

5. The memory device of claim 4, wherein the peripheral circuit chip is configured to perform an electrical die sorting (EDS) process before the peripheral circuit chip is bonded to the memory chip, wherein the EDS process inspects whether or not the test cell array and the peripheral circuit electrically operate.

6. The memory device of claim 5, wherein the test cell array further includes at least one information data block storing information data that is set through the EDS process.

7. The memory device of claim 6, wherein the memory chip is configured to perform an information data read (IDR) operation on the at least one information data block, after the memory chip is bonded to the peripheral circuit chip.

8. A memory device, comprising:
   a memory chip including a memory cell array and a first bonding pad, wherein the memory cell array includes a plurality of memory blocks each including a plurality of vertical NAND strings; and
   a peripheral circuit chip including
     at least one test block including a plurality of planar NAND strings,
     a peripheral circuit connected to the test cell array, and
     a second bonding pad,
   wherein the peripheral circuit chip is vertically connected to the memory chip via the first and second bonding pads and the memory cell array is disposed above the test cell array in a vertical direction.

9. The memory device of claim 8, wherein the first bonding pad includes:
   a plurality of first word line bonding pads respectively connected to first word lines connected to the memory cell array; and
   a plurality of first bit line bonding pads respectively connected to first bit lines connected to the memory cell array.

10. The memory device of claim 8, wherein the second bonding pad includes:
    a plurality of second word line bonding pads respectively connected to second word lines connected to the test cell array; and
    a plurality of second bit line bonding pads respectively connected to second bit lines connected to the test cell array.

11. The memory device of claim 8, wherein the peripheral circuit chip is configured to perform an electrical die sorting (EDS) process before the peripheral circuit chip is bonded to the memory chip, wherein the EDS process inspects whether or not the test cell array and the peripheral circuit electrically operate.

12. The memory device of claim 11, wherein the test cell array further includes at least one information data block storing information data that is set through the EDS process.

13. The memory device of claim 8, wherein the peripheral circuit includes a row decoder connected to the memory cell array through the first and second bonding pads and first word lines and connected to the test cell array through second word lines.

14. The memory device of claim 8, wherein the peripheral circuit includes a page buffer connected to the memory cell array through the first and second bonding pads and first bit lines and connected to the test cell array through second bit lines.

15. A method of manufacturing a memory device, the method comprising:
fabricating a memory chip including a memory cell array as a three-dimensional (3D) cell array;
fabricating a peripheral circuit chip including a test cell array as a two-dimensional (2D) cell array and a peripheral circuit connected to the 2D cell array;
performing an electrical die sorting (EDS) process on the peripheral circuit chip to inspect whether or not the 2D cell array and the peripheral circuit electrically operate; and
fabricating the memory device based on bonding the peripheral circuit chip to the memory chip, such that the memory cell array is disposed above the test cell array in a vertical direction, in response to a determination that the 2D cell array and the peripheral circuit electrically operate.

16. The method of claim 15, wherein the fabricating of the memory chip includes fabricating the memory chip on a first wafer, the memory chip including the 3D cell array connected to first word lines and first bit lines, first word line bonding pads respectively connected to the first word lines, and first bit line bonding pads respectively connected to the first bit lines.

17. The method of claim 16, wherein the fabricating of the peripheral circuit chip includes fabricating the peripheral circuit chip on a second wafer, the peripheral circuit chip including the 2D cell array connected to second word lines and second bit lines, the peripheral circuit connected to the second word lines and the second bit lines, and second word line bonding pads, and second bit line bonding pads.

18. The method of claim 17, wherein the fabricating of the memory device includes bonding the peripheral circuit chip to the memory chip based on bonding the first word line bonding pads to the second word line bonding pads and bonding the first bit line bonding pads to the second bit line bonding pads.

19. The method of claim 15, further comprising, after performing the EDS process, programming information data generated as a result of the EDS process in an information data block of the 2D cell array.

20. The method of claim 19, further comprising, when the information data is non-valid information data, re-designing the peripheral circuit.

* * * * *